(12) United States Patent
Kurimoto et al.

(10) Patent No.: US 7,492,216 B2
(45) Date of Patent: Feb. 17, 2009

(54) FILTERING APPARATUS FOR CORRECTING VARIATION OF CR-PRODUCT

(75) Inventors: Hidehiko Kurimoto, Hyogo (JP); Yasuo Oba, Shiga (JP)

(73) Assignee: Panasonic Corporation, Osaka (JP)

( * ) Notice: Subject to any disclaimer, the term of this patent is extended or adjusted under 35 U.S.C. 154(b) by 34 days.

(21) Appl. No.: 11/783,059

(22) Filed: Apr. 5, 2007

(65) Prior Publication Data

US 2008/0136547 A1 Jun. 12, 2008

(30) Foreign Application Priority Data

Apr. 5, 2006 (JP) ............................. 2006-104081

(51) Int. Cl.
*H03K 5/00* (2006.01)
(52) U.S. Cl. .................. 327/553; 327/554; 327/552
(58) Field of Classification Search .......... 327/551–559
See application file for complete search history.

(56) References Cited

U.S. PATENT DOCUMENTS 5,942,933 A * 8/1999 Yang ........................... 327/530
5,982,228 A * 11/1999 Khorramabadi et al. ...... 327/553
2006/0001482 A1 1/2006 Nakamura et al.

FOREIGN PATENT DOCUMENTS

JP 2004-172911 6/2004

* cited by examiner

*Primary Examiner*—Dinh T. Le
(74) *Attorney, Agent, or Firm*—Wenderoth, Lind & Ponack, L.L.P.

(57) ABSTRACT

A filtering apparatus includes a main filter, a variation detection circuit, and a variation correction circuit. The variation detection circuit includes a reference filter having at least one resistor and at least one capacitor, detects a variation of CR-product based on the resistor and the capacitor of the reference filter in response to each of a plurality of reference signals having different frequencies from each other, and then outputs a variation detection signal indicating a detected result. The variation correction circuit corrects frequency characteristics of the main filter on the basis of the variation detection signal.

16 Claims, 20 Drawing Sheets

FROM REFERENCE SIGNAL FREQUENCY
SELECTION CONTROLLER 7

FILTERING APPARATUS FOR CORRECTING VARIATION OF CR-PRODUCT

BACKGROUND OF THE INVENTION

1. Field of the Invention

The present invention relates to a filtering apparatus and a semiconductor apparatus having the same, and in particular, relates to the filtering apparatus which detects and corrects a variation of CR-product, which is a product of a resistance value of a resistor and a capacitance value of a capacitor, that determines frequency characteristics of the filtering apparatus in response to each of a plurality of reference signals having different frequencies from each other, and the semiconductor apparatus having the same.

2. Description of the Related Art

In recent years, in a mobile communication apparatus and the like, a filtering apparatus has high tendency to be built into a semiconductor apparatus in order to meet the increasing demand of reduction in size. In the filtering apparatus built in the semiconductor apparatus, a product of variation in absolute value peculiar to a semiconductor process generated in each of a resistor and a capacitor which configure the filtering apparatus, a so-called CR-product varies; and therefore, a variation of CR-product is generated in frequency characteristics of the filtering apparatus. Therefore, it is necessary to correct the variation of frequency characteristics of the filtering apparatus by detecting the variation of the CR-product.

FIG. 13 is a block diagram showing a configuration of a filtering apparatus according to a prior art. Referring to FIG. 13, the filtering apparatus according to the prior art includes a frequency divider 1, a reference filter 2A, a delay time detector 3, a counter 4, a switch selection controller 5, a main filter 6 and an oscillator 55. The reference filter 2A includes resistors 21 and 23, capacitors 26 and 27, and an amplifier 30. The main filter 6 includes resistors 61, 62 and 63, switches 65 to 67 respectively selecting resistors 61 to 63, and a capacitor 68.

Referring to FIG. 13, a reference signal Sa generated and outputted by the oscillator 55 is inputted to the frequency divider 1 and the counter 4. The reference signal Sa inputted to the frequency divider 1 is frequency-divided by twelve by the frequency divider 1. The reference signal Sa is then outputted to the reference filter 2A and the delay time detector 3 as a frequency-divided signal Sb. The frequency-divided signal Sb inputted to the reference filter 2A is outputted to the delay time detector 3 as a reference filter output signal Sc by delaying by a group delay time determined by an absolute value of the resistors 21 and 23 and the capacitors 26 and 27 which configure the reference filter 2A. The delay time detector 3 detects a delay time of the reference filter output signal Sc from the reference filter 2A for the frequency-divided signal Sb from the frequency divider 1, and outputs the detected delay time as a detection signal Sd of a high level time interval. At this time, since the reference filter output signal Sc is outputted delayed from the frequency-divided signal Sb by the group delay time of the reference filter 2A, the detection signal Sd outputted from the delay time detector 3 becomes a signal corresponding to a CR-product of the resistors 21 and 23 and capacitors 26 and 27 which configure the reference filter 2A. The counter 4 counts that the high level time interval of the detection signal Sd from the delay time detector 3 is how many times as long as the time cycle of the reference signal Sa, and outputs a counter output signal Se indicating a counted value. Since the high level time interval of the detection signal Sd corresponds to the CR-product of the reference filter 2A, the counter output signal Se also becomes a signal corresponding to the CR-product of the reference filter 2A. The switch selection controller 5 outputs switch selection signals Sf5, Sf6 and Sf7, respectively controlling the switches 65 to 67 of the main filter 6 in response to the value of the inputted counter output signal Se.

In the filtering apparatus according to the prior art shown in FIG. 13, an operation for correcting the variation of frequency characteristics of the main filter 6 in response to the variation of the CR-product of the reference filter 2 will be described with reference to FIG. 13 to FIG. 16. FIGS. 14, 15, and 16 are timing charts showing signals of respective sections where the variation of the CR-product of the reference filter 2 in the filtering apparatus of FIG. 13 are −10%, 0% and 10%, respectively. Further, "the variation of the CR-product being 0%" indicates that the CR-product is equal to a standard value.

As shown in FIG. 14 to FIG. 16, with an increase of the variation of the CR-product of the reference filter 2 in the order of −10%, 0% and +10%, the delay time of the reference filter output signal Sc for the frequency-divided signal Sb changes, and the high level time interval of the detection signal Sd of the delay time detector 3 becomes longer. The counter 4 counts that the high level time interval of the detection signal Sd is how many times as long as the time cycle of the inputted reference signal Sa, and outputs the counter output signal Se. Therefore, the counted value of the counter 4 increases with the increase of the variation of the CR-product of the reference filter 2 in the order of −10%, 0% and +10%; and consequently, the maximum value of the counter output signal Se also increases. As shown in FIG. 14 to FIG. 16, with the increase of the variation of the CR-product in the order of −10%, 0% and +10%, the maximum value of the counter output signal Se becomes "5," "6" and "7", respectively. Thus the variation of the CR-product of the reference filter 2 is detected.

The switch selection controller 5 outputs the switch selection signals Sf5 to Sf7 for controlling the switches 65 to 67, respectively, so that only the switch 65 is turned on among the three switches 65, 66 and 67 of the main filter 6 when the maximum value of the counter output signal Se is "5"; only the switch 66 is turned on among the three switches 65, 66 and 67 of the main filter 6 when the maximum value of the counter output signal Se is "6"; and only the switch 67 is turned on among the three switches 65, 66 and 67 of the main filter 6 when the maximum value of the counter output signal Se is "7."

In the main filter 6, a resistance value of the resistor 61 is set so as to be larger by 11.1% than that of the resistor 62, and a resistance value of the resistor 63 is set so as to be smaller by 9.1% than that of the resistor 62. Thus the frequency characteristics of the main filter 6 are corrected in response to the detected variation of CR-product of the reference filter 2.

Specifically, for example, when the CR-product of the reference filter 2A is not varied, that is, when the variation of the CR-product of the reference filter 2A is 0%, the maximum value of the counter output signal Se becomes "6" as shown in FIG. 15; and only the switch 66 of the main filter 6 is controlled to be turned on by the switch selection controller 5, and the resistor 62 is selected.

When the variation of the CR-product of the reference filter 2A is −10%, the delay time at the reference filter 2A becomes shorter; therefore, the maximum value of the counter output signal Se becomes "5" as shown in FIG. 14, and the switch 65 of the main filter 6 is controlled to be turned on by the switch selection controller 5. Thus the resistor 61 having the resistance value larger by 11.1% than that of the resistor 62 is selected. Therefore, as compared with the case that the variation of the CR-product of the reference filter 2A is 0%, the CR-product of the main filter 6 has a magnification given by the following equation (1), and becomes almost the same value as compared with the case that the variation of the CR-product of the reference filter 2A is 0%. That is, even if the CR-product of the reference filter 2A varies, the switches 65 to 67 of the main filter 6 are controlled by the switch selection controller 5 to be corrected to an appropriate resistance value; and therefore, the frequency characteristics of the main filter 6 are not changed.

$$\{(100-10)/100\} \times \{(100+11.1)/100\} = 0.9999 \quad (1)$$

When the variation of the CR-product of the reference filter 2A is 10%, the delay time at the reference filter 2A becomes longer. Therefore, the maximum value of the counter output signal Se becomes "7" as shown in FIG. 16, and the switch 67 of the main filter 6 is controlled to be turned on by the switch selection controller 5; and the resistor 63 having the resistance value smaller by 9.1% than that of the resistor 62 is selected. Therefore, as compared with the case that the variation of the CR-product of the reference filter 2A is 0%, the CR-product of the main filter 6 has a magnification given by the following equation (2), and becomes almost the same value as compared with the case that the variation of the CR-product of the reference filter 2A is 0%. That is, even if the CR-product of the reference filter 2A varies, the switches 65 to 67 of the main filter 6 are controlled by the switch selection controller 5 to be corrected to an appropriate resistance value. Therefore, the frequency characteristics of the main filter 6 are not changed.

$$\{(100+10)/100\} \times \{(100-9.1)/100\} = 0.9999 \quad (2)$$

As described above, the filtering apparatus according to the prior art detects the variation of the CR-product, and corrects the variation of frequency characteristics of the filtering apparatus.

Further, there is disclosed Japanese Patent Laid-open Publication No. 2004-172911 as a patent document related to the present invention.

However, a method of detecting the variation of the CR-product in the filtering apparatus according to the prior art is to count by the counter 4 that the high level time interval of the detection signal Sd corresponding to the CR-product is how many times as long as the time cycle of the reference signal Sa. Therefore, there is a problem in that, when the frequency of the reference signal Sa changes, the variation of the CR-product cannot be correctly detected, and the variation of frequency characteristics of the filtering apparatus cannot be accurately corrected.

In this case, an operation of the filtering apparatus in the case where the CR-product is the same and the frequency of the reference signal Sa is different from each other will be described with reference to FIGS. 17 and 18. FIG. 17 is a timing chart showing signals of respective sections in the case where the frequency of the reference signal Sa is a frequency f1 in the filtering apparatus of FIG. 13. FIG. 18 is a timing chart showing signals of respective sections in the case where the frequency of the reference signal Sa is 1.5 times as high as the frequency f1 in the filtering apparatus of FIG. 13.

In FIGS. 17 and 18, when the frequency of the reference signal Sa is different from each other, the frequency of the frequency-divided signal Sb is also different. However, since the delay time of the reference filter 2A is determined by the absolute value of the resistors 21 and 23 and the capacitors 26 and 27, the delay time of the reference filter output signal Sc for the frequency-divided signal Sb is not changed when the CR-product of the reference filter 2A is the same. Therefore, the high level time interval of the detection signal Sd from the delay time detector 3 is not changed. The counter 4 counts that the high level time interval of the detection signal Sd is how many times as long as the time cycle of the reference signal Sa. Therefore, when the frequency of the reference signal Sa varies, the counter output signal Se detected by the counter 4 changes depending on the frequency of the reference signal Sa.

As shown in FIG. 17, when the frequency of the reference signal Sa is the frequency f1, the maximum value of the counter output signal Se is "6". However, as shown in FIG. 18, when the frequency of the reference signal Sa is 1.5 times as high as the frequency f1, the maximum value of the counter output signal Se becomes "9." The switch selection controller 5 controls the switches of the main filter 6 in response to the value of the inputted counter output signal Se. Therefore, if the counter output signal Se is changed, a different resistor is selected in the main filter 6, and as a result, the frequency characteristics of the main filter 6 are changed.

As described above, in the filtering apparatus according to the above prior art, when the frequency of the reference signal Sa is changed, for example, when a plurality of the reference signals Sa are used, the variation of the CR-product of the reference filter 2A cannot be correctly detected. Therefore, a resistor which is not optimum for the variation of the CR-product of the reference filter 2A is selected in the main filter 6; and consequently, the variation of frequency characteristics of the main filter 6 cannot be accurately corrected.

SUMMARY OF THE INVENTION

The object of the present invention is to solve the foregoing problem and to provide a filtering apparatus which correctly detects a variation of CR-product and accurately corrects a variation of frequency characteristics of the filtering apparatus even in the case where a plurality of reference signals having different frequencies from each other are used, and a semiconductor apparatus having the same.

According to a first aspect of the present invention, there is provided the filtering apparatus includes a main filter, a variation detection and a variation correction circuit. The variation detection circuit includes a reference filter having at least one first resistor and at least one first capacitor, detects the first capacitor of the reference filter and a variation of CR-product based on the first resistor in response to each of a plurality of reference signals having different frequencies from each other, and outputs a variation detection signal indicating a detected result. The variation correction circuit corrects frequency characteristics of the main filter on the basis of the variation detection signal.

In the above filtering apparatus, the variation detection circuit includes a first frequency divider, a first reference signal frequency selection controller, a first delay time detector and a first counter. The first frequency divider frequency-divides the reference signal by a predetermined first frequency division ratio, and outputs a first frequency-divided signal to the reference filter. The first reference signal frequency selection controller switches over group delay characteristics of the reference filter based on the first resistor and the first capacitor of the reference filter to select one of the group delay characteristics, on the basis of the frequency of the reference signal. The first delay time detector detects and outputs a delay time of an output signal of the reference filter for the first frequency-divided signal. The first counter counts a multiple of a signal time cycle of the reference signal for the delay time detected by the first delay time detector, and outputs the variation detection signal including a counted result to the variation correction circuit.

In this case, in the above filtering apparatus, the reference filter has one of a plurality of first resistors and a plurality of first capacitors. The first reference signal frequency selection controller switches the group delay characteristics of the reference filter by selecting one of at least one resistor, at least one capacitor of the plurality of first resistors and the plurality of first capacitors on the basis of the frequency of the reference signal.

In addition, in the above filtering apparatus, the variation detection circuit includes a frequency division ratio change circuit, a second frequency divider, a second reference signal frequency selection controller, a second delay time detector and a second counter. The frequency division ratio change circuit frequency-divides the reference signal by a different frequency division ratio in response to the frequency of the reference signal, and outputs a second frequency-divided signal. The second frequency divider frequency-divides the second frequency-divided signal by a predetermined second frequency division ratio, and outputs a third frequency-divided signal to the reference filter. The second reference signal frequency selection controller switches over the frequency division ratios of the frequency division ratio change circuit on the basis of the frequency of the reference signal. The second delay time detector detects and outputs a delay time of an output signal of the reference filter for the third frequency-divided signal. The second counter counts a multiple of a signal time cycle of the second frequency-divided signal for the delay time detected by the second delay time detector, and outputs the variation detection signal including a counted result to the variation correction circuit.

Further, in the above filtering apparatus, the variation detection circuit includes a first frequency divider, a first delay time detector, a third counter and a third reference signal frequency selection controller. The first frequency divider frequency-divides the reference signal by a predetermined first frequency division ratio, and outputs a first frequency-divided signal to the reference filter. The first delay time detector detects a delay time of an output signal of the reference filter for the first frequency-divided signal. The third counter counts a multiple of a signal time cycle of the reference signal for a delay time detected by the first delay time detector, multiplies a counted result by a correction coefficient which differs depending on the frequency of the reference signal, and outputs the variation detection signal including a multiplied result to the variation correction circuit. The third reference signal frequency selection controller switches over the correction coefficient of the third counter on the basis of the frequency of the reference signal.

Still further, in the above filtering apparatus, the main filter is shared by the reference filter.

In addition, in the above filtering apparatus, the main filter includes a plurality of second resistors and a plurality of second capacitors. The variation correction circuit includes a switch selection controller. The switch selection controller switches over the frequency characteristics of the main filter by selecting one of at least one resistor, at least one capacitor of the plurality of second resistors and the plurality of second capacitors on the basis of the variation detection signal.

Further, in the above filtering apparatus, the filtering apparatus further includes an oscillator. The oscillator generates and outputs the reference signal.

According to a second aspect of the present invention, there is provided a semiconductor apparatus having a filtering apparatus. The filtering apparatus includes a main filter, a variation detection circuit and a variation correction circuit. The variation detection circuit includes a reference filter having at least one first resistor and at least one first capacitor, detects a variation of CR-product based on the first resistor and the first capacitor of the reference filter in response to each of a plurality of reference signals having different frequencies from each other, and outputs a variation detection signal indicating a detected result. The variation correction circuit corrects frequency characteristics of the main filter on the basis of the variation detection signal.

According to the filtering apparatus and the semiconductor apparatus having the same according to the present invention, there is an effect that, even in the case where a plurality of reference signals having different frequencies from each other are used, a variation of CR-product of the reference filter in response to each of the plurality of reference signals can be correctly detected, a variation of frequency characteristics of the main filter can be accurately corrected, and the frequency characteristics of the filtering apparatus can be always substantially constant.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
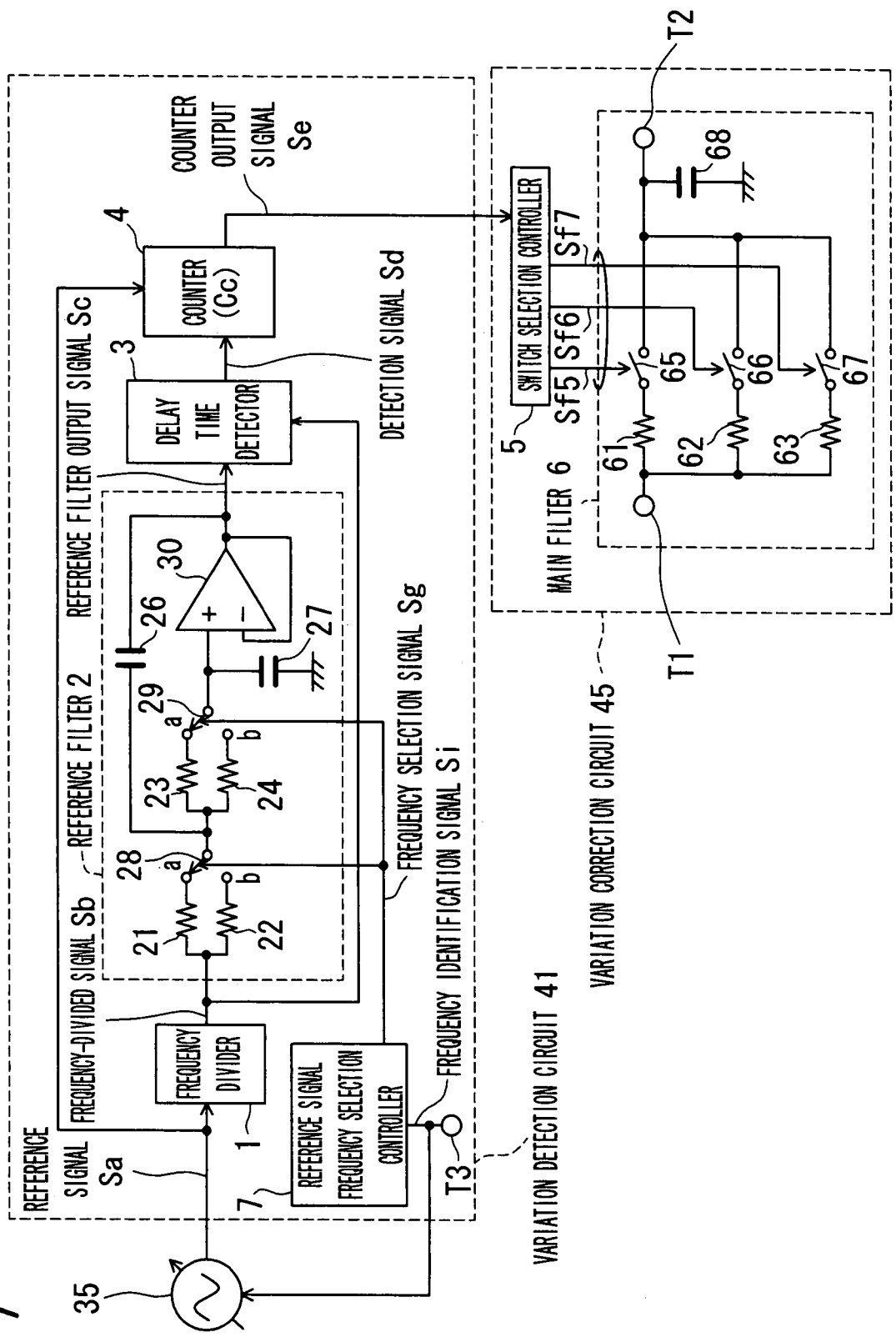
FIG. 1 is a block diagram showing a configuration of a filtering apparatus according to a first preferred embodiment of the present invention.

Preferred embodiments according to the present invention will be described below with reference to the drawings. Further, the same reference numerals as those shown in the drawings represent the same elements.

First Preferred Embodiment

FIG. 1 is a block diagram showing a configuration of a filtering apparatus according to a first preferred embodiment of the present invention. Referring to FIG. 1, the filtering apparatus according to the present preferred embodiment is built in a semiconductor apparatus such as a semiconductor integrated circuit, and includes an oscillator 35, a variation detection circuit 41, and variation correction means 45. The variation detection circuit 41 includes a frequency divider 1, a reference filter 2, a delay time detector 3, a counter 4, and a reference signal frequency selection controller 7. The reference filter 2 includes resistors 21, 22, 23 and 24, capacitors 26 and 27, switches 28 and 29; and an amplifier 30. The variation correction circuit 45 includes a switch selection controller 5 and a main filter 6. The main filter 6 includes resistors 61, 62 and 63, switches 65, 66 and 67 connected in series to the resistors 61, 62 and 63, respectively, and a capacitor 68.

Referring to FIG. 1, the oscillator 35 generates and outputs a reference signal Sa in a different oscillation frequency depending on a frequency identification signal Si which is for identifying a frequency of the reference signal Sa and which is inputted via a frequency identification signal input terminal T3. The reference signal Sa from the oscillator 35 is inputted to the frequency divider 1 and the counter 4. The reference signal Sa inputted to the frequency divider 1 is frequency-divided by twelve by the frequency divider 1, and outputted to the reference filter 2 and the delay time detector 3 as a frequency-divided signal Sb. The reference signal frequency selection controller 7 generates and outputs a frequency selection signal Sg for switching over group delay characteristics of the reference filter 2 in response to the frequency identification signal Si inputted via the frequency identification signal input terminal T3. The frequency selection signal Sg is set to control such that the amount of group delay of the reference filter 2 is inversely proportional to the frequency of the reference signal Sa.

In the reference filter 2, one ends of the resistors 21 and 22 are connected to the frequency divider 1; the other end of the resistor 21 is connected to one ends of the resistors 23 and 24 via a contact "a" of the switch 28; and the other end of the resistor 22 is connected to the one ends of the resistors 23 and 24 via a contact "b" of the switch 28. The other end of the resistor 23 is connected to a non-inversion input terminal of the amplifier 30 via a contact "a" of the switch 29; and the other end of the resistor 24 is connected to the non-inversion input terminal of the amplifier 30 via a contact "b" of the switch 29. The inversion input terminal of the amplifier 30 is connected to an output terminal of the amplifier 30; and the output terminal of the amplifier 30 is connected to the delay time detector 3. In addition, the capacitor 26 is connected between the output terminal of the amplifier 30 and a node between the switch 28 and the resistors 23 and 24; and the capacitor 27 is connected between a ground potential and a node between the non-inversion input terminal of the amplifier 30 and the switch 29. The switches 28 and 29 are controlled by the frequency selection signal Sg from the reference signal frequency selection controller 7.

The frequency-divided signal Sb inputted to the reference filter 2 is outputted to the delay time detector 3 as a reference filter output signal Sc by being delayed by a group delay time which is determined by an absolute value of resistors respectively selected by the switches 28 and 29 among the resistors 21 to 24 and the capacitors 26 and 27.

The delay time detector 3 detects the delay time of the reference filter output signal Sc from the reference filter 2 for the frequency-divided signal Sb from the frequency divider 1, and outputs the detected delay time detected by the delay time detector 3 as a high level time interval of a detection signal Sd. At this time, since the reference filter output signal Sc is outputted by being delayed from the frequency-divided signal Sb by a time corresponding to the amount of group delay of the reference filter 2, the detection signal Sd outputted from the delay time detector 3 becomes a signal corresponding to a CR-product determined by the resistors respectively selected by the switches 28 and 29 among the resistors 21 to 24 and the capacitors 26 and 27 of the reference filter 2.

The counter 4 counts that the high level time interval of the detection signal Sd from the delay time detector 3 is how many times as long as the time cycle of the inputted reference signal Sa, and outputs a counter output signal Se indicating a counted value Cc. Since the high level time interval of the detection signal Sd corresponds to the CR-product of the reference filter 2, a value of the counter output signal Se also becomes a signal corresponding to the CR-product of the reference filter 2. The switch selection controller 5 outputs switch selection signals Sf5, Sf6 and Sf7 for controlling switches 65, 66 and 67, respectively, in order to control frequency characteristics of the main filter 6 in response to the counted value Cc included in the inputted counter output signal Se.

In the main filter 6, a series circuit of the resistor 61 and the switch 65, a series circuit of the resistor 62 and the switch 66, and a series circuit of the resistor 63 and the switch 67 are connected in parallel with each other between a main filter input terminal T1 and a main filter output terminal T2 to configure a parallel circuit; and the capacitor 68 is connected between the ground potential and a node between the parallel circuit and the main filter output terminal T2.

In the filtering apparatus configured as described above, a specific example will be described below on the case where the frequency of the reference signal Sa is changed at 1 MHz and 1.5 MHz, respectively. First of all, when the oscillator 35 generates and outputs the reference signal Sa having the frequency of 1 MHz, the reference signal frequency selection controller 7 recognizes by the frequency identification signal Si that the frequency of the reference signal Sa is 1 MHz, and outputs the frequency selection signal Sg having the high level. When the frequency selection signal Sg has the high level, the switch 28 of the reference filter 2 is switched over to the contact "a" so as to select the resistor 21, and the switch 29 is switched over to the contact "a" so as to select the resistor 23.

In addition, when the oscillator 35 generates the reference signal Sa having the frequency of 1.5 MHz and outputs the same, the reference signal frequency selection controller 7 recognizes by the frequency identification signal Si that the frequency of the reference signal Sa is 1.5 MHz, and outputs the frequency selection signal Sg having the low level. When the frequency selection signal Sg has the low level, the switch 28 is switched over to the contact "b" so as to select the resistor 22; and the switch 29 is switched over to the contact "b" so as to select the resistor 24. This leads to that the amount of group delay of the reference filter 2 can be controlled in response to the frequency selection signal Sg.

At this time, when a resistance value of the resistor 21 of the reference filter 2 is set to be 1.5 times as large as a resistance value of the resistor 22 and a resistance value of the resistor 23 is set to be 1.5 times as large as a resistance value of the resistor 24, each resistance values of the two resistors 21 and 23 of the reference filter 2 to be selected in the case where the frequency of the reference signal Sa is 1 MHz become 1.5 times as large as the respective values of the two resistors 22 and 24 of the reference filter 2 to be selected in the case where the frequency of the reference signal Sa is 1.5 MHz. Therefore, the amount of group delay of the reference filter 2 at the time that the frequency of the reference signal Sa is 1 MHz becomes 1.5 times as large as the amount of group delay of the reference filter 2 at the time that the frequency of the reference signal Sa is 1.5 MHz. In the present preferred embodiment, the amount of group delay of the reference filter 2 is set so as to be inversely proportional to the frequency of the reference signal Sa.

Figure 2:
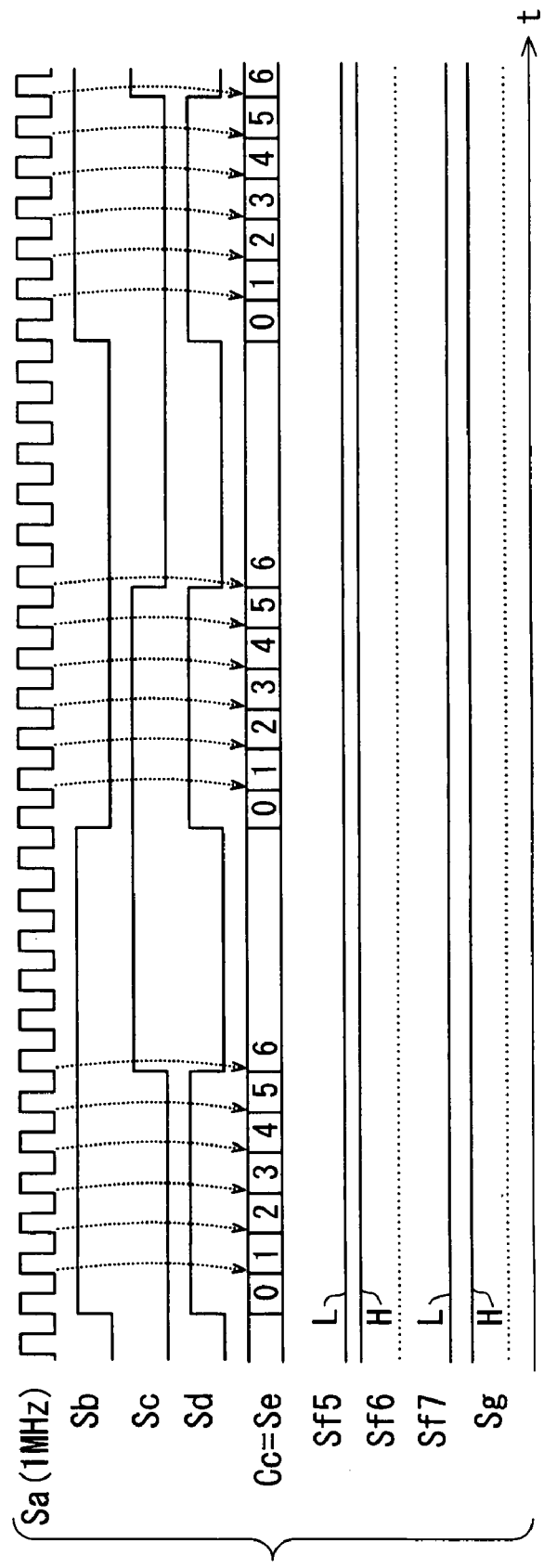
FIG. 2 is a timing chart showing signals of respective sections in the case where a frequency of a reference signal Sa in the filtering apparatus of FIG. 1 is 1 MHz.
Figure 3:
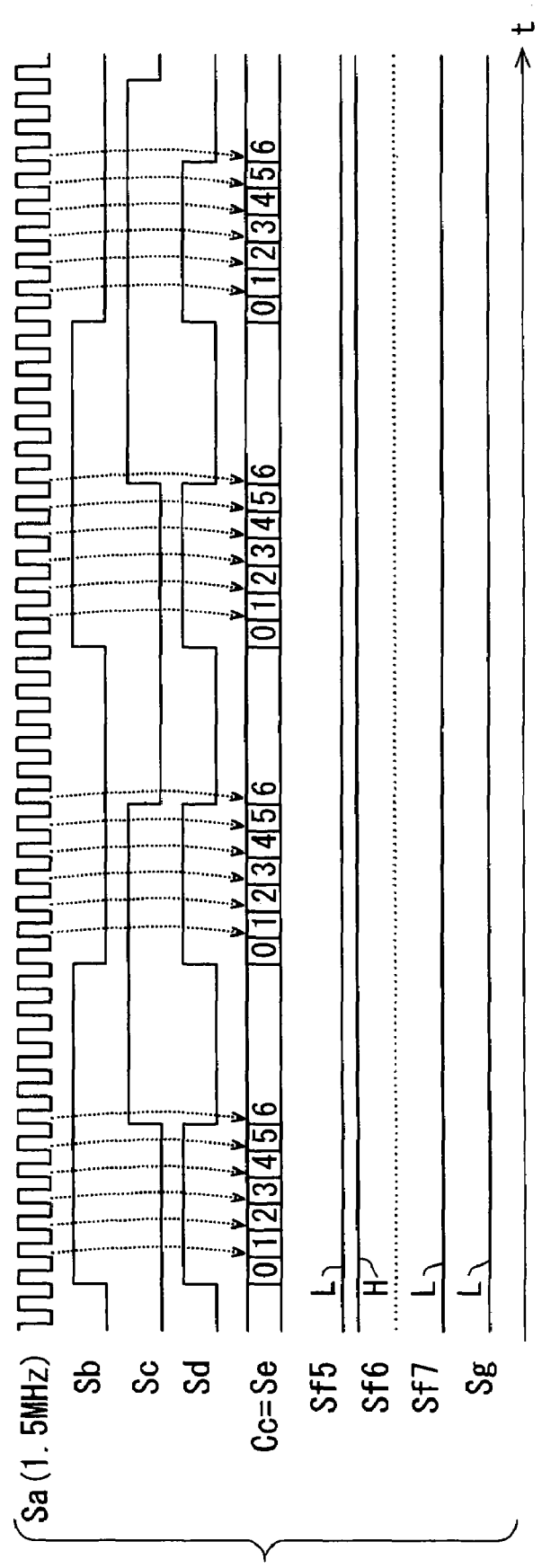
FIG. 3 is a timing chart showing signals of respective sections in the case where the frequency of the reference signal Sa in the filtering apparatus of FIG. 1 is 1.5 MHz.

FIGS. 2 and 3 are timing charts showing signals of respective sections in the case where the frequencies of the reference signal Sa in the filtering apparatus of FIG. 1 are 1 MHz and 1.5 MHz, respectively. As shown in FIGS. 2 and 3, even in any case where the frequency of the reference signal Sa is 1 MHz, or the frequency of the reference signal Sa is 1.5 MHz, the frequency divider 1 frequency-divides the reference signal Sa by twelve, and outputs the frequency-divided signal Sb. The frequency-divided signal Sb is delayed by the reference filter 2 by a time of the amount of group delay of the reference filter 2, and is outputted as the reference filter output signal Sc. At this time, the amount of group delay of the reference filter 2 is controlled by the frequency selection signal Sg of the reference signal frequency selection controller 7. Therefore, the amount of group delay of the reference filter 2 at the time that the frequency of the reference signal Sa is 1 MHz becomes 1.5 times as large as the amount of group delay of the reference filter 2 at the time that the frequency of the reference signal Sa is 1.5 MHz. The delay time detector 3 detects a delay time of the reference filter output signal Sc for the frequency-divided signal Sb, and outputs the detection signal Sd having the high level time interval corresponding to the delay time. Therefore, the high level time interval of the detection signal Sd at the time that the frequency of the reference signal Sa is 1 MHz becomes 1.5 times as long as the high level time interval of the detection signal Sd at the time that the frequency of the reference signal Sa is 1.5 MHz.

The detection signal Sd from the delay time detector 3 is inputted to the counter 4, the counter 4 counts that the high level time interval of the detection signal Sd is how many times as long as the time cycle of the reference signal Sa, and outputs the counter output signal Se. At this time, the high level time interval of the detection signal Sd at the time that the frequency of the reference signal Sa is 1 MHz becomes 1.5 times as long as the high level time interval of the detection signal Sd at the time that the frequency of the reference signal Sa is 1.5 MHz, and the time cycle of the reference signal Sa having 1 MHz also becomes 1.5 times as long as the time cycle of the reference signal Sa having 1.5 MHz. Therefore, the counter output signal Se of the counter 4 becomes the same result regardless of the frequency of the reference signal Sa. As shown in FIGS. 2 and 3, even in any case where the frequency of the reference signal Sa is 1 MHz, or the frequency of the reference signal Sa is 1.5 MHz, the maximum value of the counter output signal Se is "6," and the result of the counter output signal Se is not changed even in the case where the frequency of the reference signal Sa varies.

The switch selection controller 5 controls the switches 65 to 67 of the main filter 6 in response to a value of the counter output signal Se. Even if the frequency of the reference signal Sa varies, the result of the counter output signal Se is not changed. Therefore, the same switch is turned on in the main filter 6 and the same resistor is selected; and therefore, the frequency characteristics of the main filter 6 are not changed.

As described above, according to the filtering apparatus according to the preferred embodiment, in the configuration that the resistor of the main filter 6 is selected in response to the variation of the CR-product of the reference filter 2 for the reference signal Sa having a certain particular frequency, even in the case where a plurality of reference signals Sa having different frequencies are used, the variation of the CR-product of the reference filter 2 can be correctly detected, the variation of the frequency characteristics of the main filter 6 can be accurately corrected, and the frequency characteristics of the main filter 6 can be always substantially constant.

Further, in the present preferred embodiment, the case where the frequency of the reference signal Sa is 1 MHz is compared with the case where the frequency of the reference signal Sa is 1.5 MHz. However, the present invention is not limited to the frequencies of the reference signal Sa of 1 MHz and 1.5 MHz, but a reference signal Sa having a different frequency may be used. In addition, the reference signal Sa is switched over to two frequencies of 1 MHz and 1.5 MHz; however, the present invention is not limited to this, but, the reference signal Sa may be switched over to frequencies not less than three. In this case, the amount of group delay of the reference filter 2 may be switched over so as to be inversely proportional to the frequency of the reference signal Sa by the reference signal frequency selection controller 7 by the number of changes in frequency of the reference signal Sa.

In addition, the reference filter 2 may output the reference filter output signal Sc obtained by delaying the frequency-divided signal Sb by the group delay time according to the CR-product of the reference filter 2; and the reference filter 2 may had a circuit configuration other than the circuit configuration shown in FIG. 1, if that is the case where the reference filter 2 includes a resistor and a capacitor.

Further, in the preferred embodiment, the resistors connected by the switches 28 and 29 are switched over in order to switch over the amount of group delay of the reference filter 2. However, other elements may be switched over if that is the case where the amount of group delay can be switched over.

Figure 19:
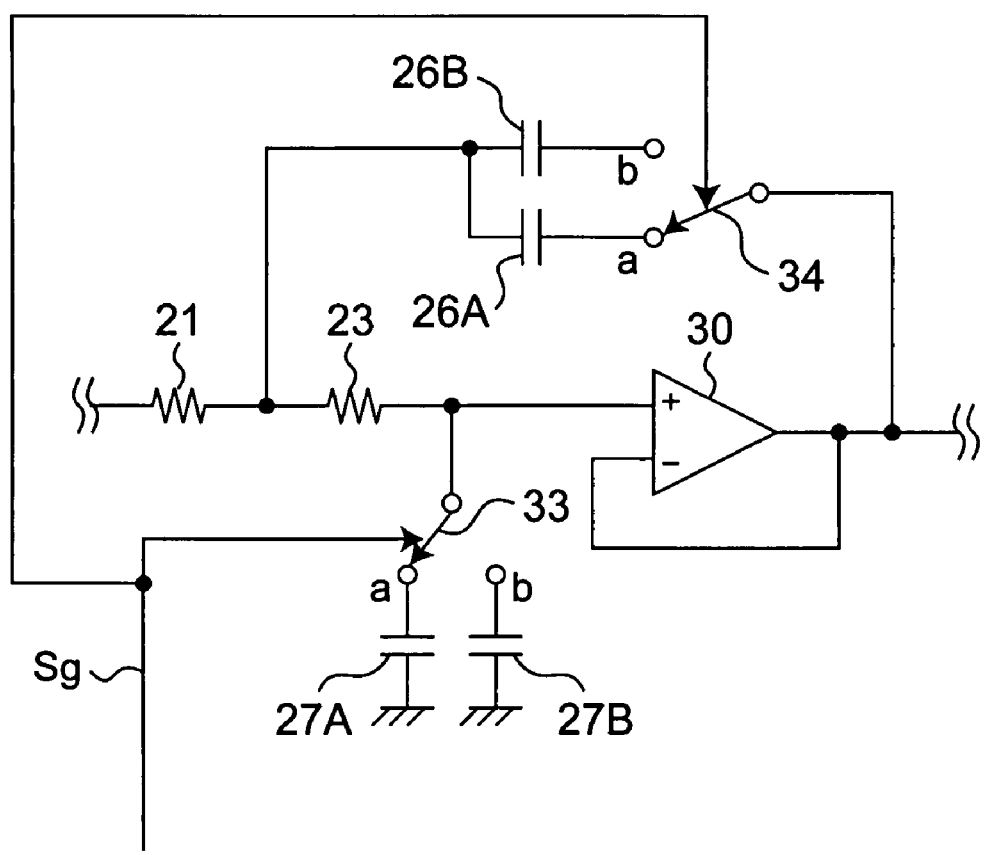
FIG. 19 is a circuit diagram showing a configuration of a reference filter of a filtering apparatus according to a first modified embodiment of the first preferred embodiment of the present invention.

For example, as shown in FIG. 19, in place of switching over a plurality of resistors, a plurality of capacitors may be switched over, or a plurality of resistors and a plurality of capacitors may be switched over.

FIG. 19 is a circuit diagram showing a configuration of a reference filter 2 of a filtering apparatus according to a first modified embodiment of the first preferred embodiment of the present invention. Referring to FIG. 19, the reference filter 2 includes capacitors 27A and 27B connected between a non-inversion input terminal of an amplifier 30 and a ground potential via contacts "a" and "b" of a switch 33, respectively, and capacitors 26A and 26B each connected between an output terminal of the amplifier 30 and a node between resistors 21 and 23 via contacts "a" and "b" of a switch 34, respectively. The switches 33 and 34 are selectively switched over to the contact "a" or the contact "b" by a frequency selection signal Sg from a reference signal frequency selection controller 7 to switch the capacitors to be connected. Therefore group delay characteristics of the reference filter 2 are switched over.

Still further, in the present preferred embodiment, the resistors connected by the switches 65 to 67 are switched over in order to correct the frequency characteristics of the main filter 6. However, other elements may be switched over if the frequency characteristics can be switched over. For example, as shown in FIG. 20, in place of switching over a plurality of resistors, a plurality of capacitors may be switched over, or a plurality of resistors and a plurality of capacitors may be switched over.

Figure 20:
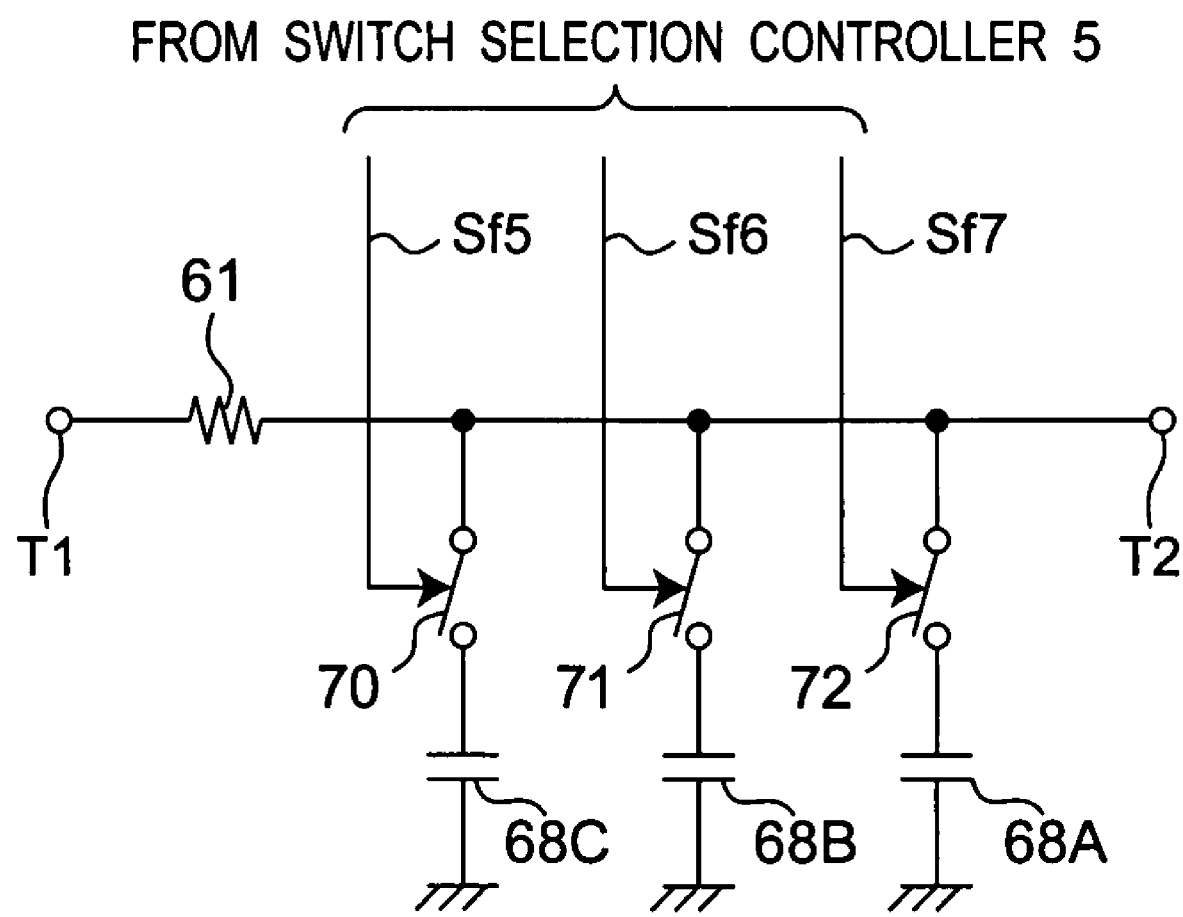
FIG. 20 is a circuit diagram showing a configuration of a main filter of a filtering apparatus according to a second modified embodiment of the first preferred embodiment of the present invention.

FIG. 20 is a circuit diagram showing a configuration of a main filter 6 of a filtering apparatus according to a second modified embodiment of the first preferred embodiment of the present invention. Referring to FIG. 20, the main filter 6 includes a resistor 61 connected between a main filter input terminal T1 and a main filter output terminal T2; and capacitors 68C, 68B and 68A respectively connected in parallel via switches 70, 71 and 72 between a ground potential and nodes between the resistor 61 and the main filter output terminal T2. The switches 70 to 72 are respectively switched over by switch selection signals Sf5, Sf6 and Sf7 from a switch selection controller 5 to switch the capacitors to be connected. Therefore the frequency characteristics of the main filter 6 are switched over.

In addition, as for the detection signal Sd of the delay time detector 3 in the present preferred embodiment, the delay time of the reference filter output signal Sc for the detected frequency-divided signal Sb is outputted as the high level time interval of the detection signal Sd. However, the present invention is not limited to the high level time interval, but, the delay time may be outputted as the low level time interval of the detection signal Sd.

Second Preferred Embodiment

Figure 4:
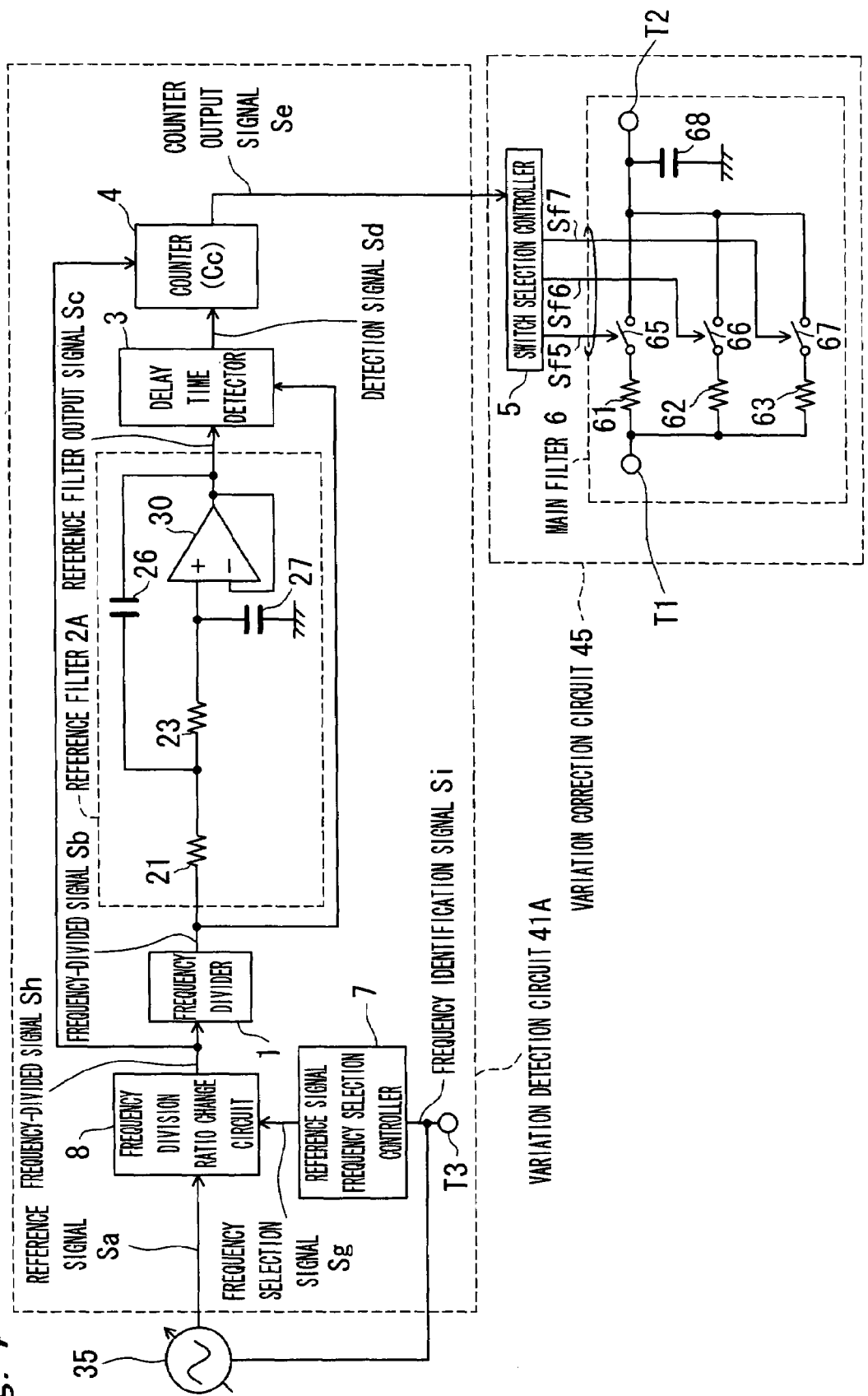
FIG. 4 is a block diagram showing a configuration of a filtering apparatus according to a second preferred embodiment of the present invention.

FIG. 4 is a block diagram showing a configuration of a filtering apparatus according to a second preferred embodiment of the present invention. The filtering apparatus of the present preferred embodiment is different in that a variation detection circuit 41A is provided in place of the variation detection circuit 41, as compared with the filtering apparatus according to the first preferred embodiment shown in FIG. 1. The variation detection circuit 41A is different in that a frequency division ratio change circuit 8 is further provided, and a reference filter 2A is provided in place of the reference filter 2, as compared with the variation detection circuit 41 of FIG. 1. The other configurations other than that are the same as the filtering apparatus according to the first preferred embodiment shown in FIG. 1, and repeated description of components labeled with the same reference numerals will be omitted.

Referring to FIG. 4, the frequency division ratio change circuit 8 frequency-divides a reference signal Sa inputted from the oscillator 35 by a frequency division ratio based on a frequency selection signal Sg, and then outputs a frequency-divided signal Sh having a predetermined frequency. The reference signal frequency selection controller 7 outputs a frequency selection signal Sg which controls the frequency division ratio of the frequency division ratio change circuit 8 so that a signal frequency of the frequency-divided signal Sh becomes constant in response to a frequency identification signal Si inputted via a frequency identification signal input terminal T3. The reference filter 2A is different in that the switches 28 and 29 and the resistors 22 and 24 are deleted as compared with the reference filter 2 of FIG. 1; and a series circuit of resistors 21 and 23 is connected between a non-inversion input terminal of an amplifier 30 and a frequency divider 1.

In the filtering apparatus configured as described above, a specific example will be described below on the case where the frequency of the reference signal Sa is changed at 1 MHz and 1.5 MHz, respectively.

Figure 5:
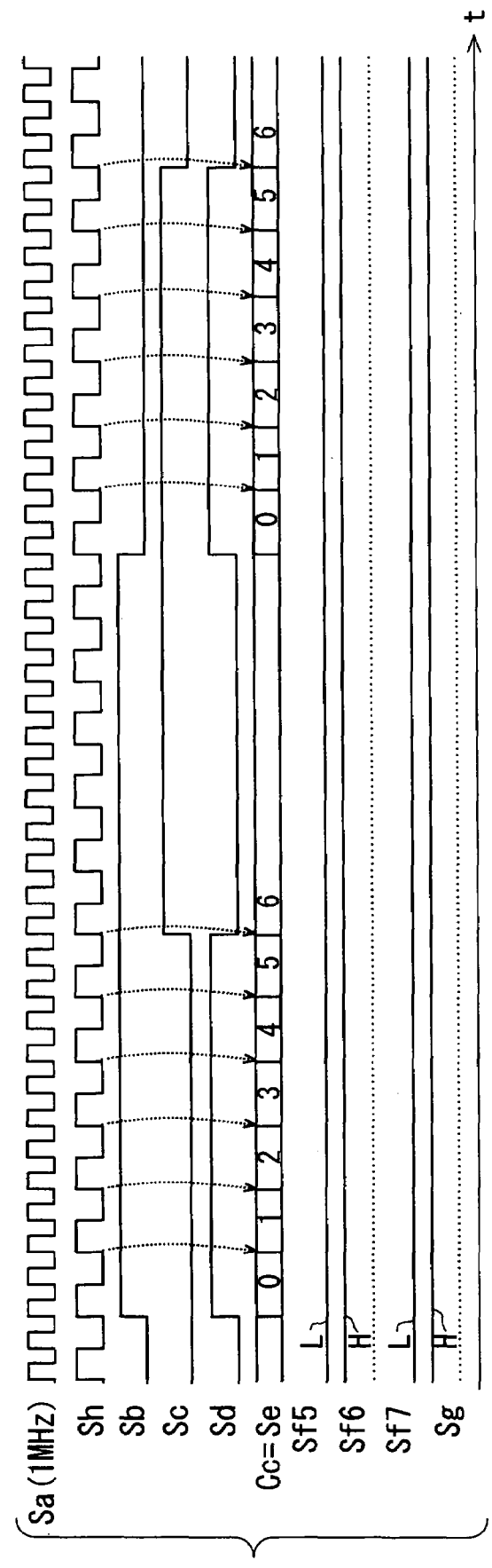
FIG. 5 is a timing chart showing signals of respective sections in the case where a frequency of a reference signal Sa in the filtering apparatus of FIG. 4 is 1 MHz.
Figure 6:
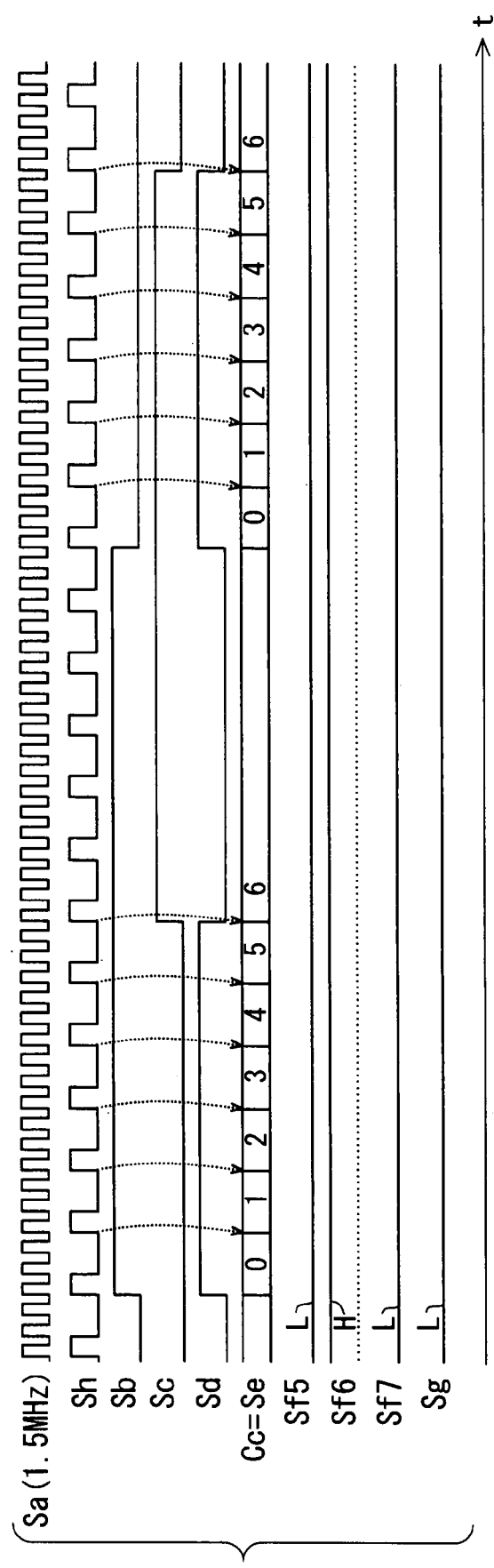
FIG. 6 is a timing chart showing signals of respective sections in the case where the frequency of the reference signal Sa in the filtering apparatus of FIG. 4 is 1.5 MHz.

FIGS. 5 and 6 are timing charts showing signals of respective sections in the case where the frequencies of the reference signal Sa in the filtering apparatus of FIG. 4 are 1 MHz and 1.5 MHz, respectively. As shown in FIG. 5, when the frequency of the reference signal Sa is 1 MHz, the frequency selection signal Sg of the reference signal frequency selection controller 7 becomes the high level; and the frequency division ratio of the frequency division ratio change circuit 8 is set to one-half frequency division. In addition, as shown in FIG. 6, when the frequency of the reference signal Sa is 1.5 MHz, the frequency selection signal Sg of the reference signal frequency selection controller 7 becomes the low level; and the frequency division ratio of the frequency division ratio change circuit 8 is set to one-third frequency division. At this time, when the frequency of the reference signal Sa is 1 MHz, and when the frequency of the reference signal Sa is 1.5 MHz, the frequency division ratios of the frequency division ratio change circuit 8 are set to one-half frequency division and one-third frequency division, respectively. Therefore, even in the case where the frequencies of the reference signal Sa varies, the respective frequencies of the divided signal Sh from the frequency division ratio change circuit 8 are the same, that is, 500 kHz. Therefore, even if the frequencies of the reference signal Sa varies, respective signals after the frequency divider 1 are not changed, and frequency characteristics of a main filter 6 are not changed.

As described above, according to the filtering apparatus according to the preferred embodiment, in the configuration that the resistor of the main filter 6 is selected in response to a variation of CR-product of the reference filter 2A for the reference signal Sa having a certain particular frequency, even in the case where a plurality of reference signals Sa having different frequencies are used, the variation of the CR-product of the reference filter 2A can be correctly detected, the variation of frequency characteristics of the main filter 6 can be accurately corrected, and the frequency characteristics of the main filter 6 can be always substantially constant.

Further, in the present preferred embodiment, the reference signal Sa is switched over to two frequencies of 1 MHz and 1.5 MHz. However, the present invention is not limited to the frequencies of the reference signal Sa of 1 MHz and 1.5 MHz, but, the reference signal Sa may be switched over to frequencies is not less than three. In this case, the frequency division ratio of the frequency division ratio change circuit 8 may be switched over by the reference signal frequency selection controller 7 so that a signal frequency of the frequency-divided signal Sh outputted from the frequency division ratio change circuit 8 becomes always substantially constant.

In addition, the reference filter 2A may output the reference filter output signal Sc obtained by delaying the frequency-divided signal Sb by the group delay time depending on the CR-product of the reference filter 2A. The reference filter 2A may be a circuit configuration other than the circuit configuration shown in FIG. 3 if that is the case where the reference filter 2A includes a resistor and a capacitor.

Third Preferred Embodiment

Figure 7:
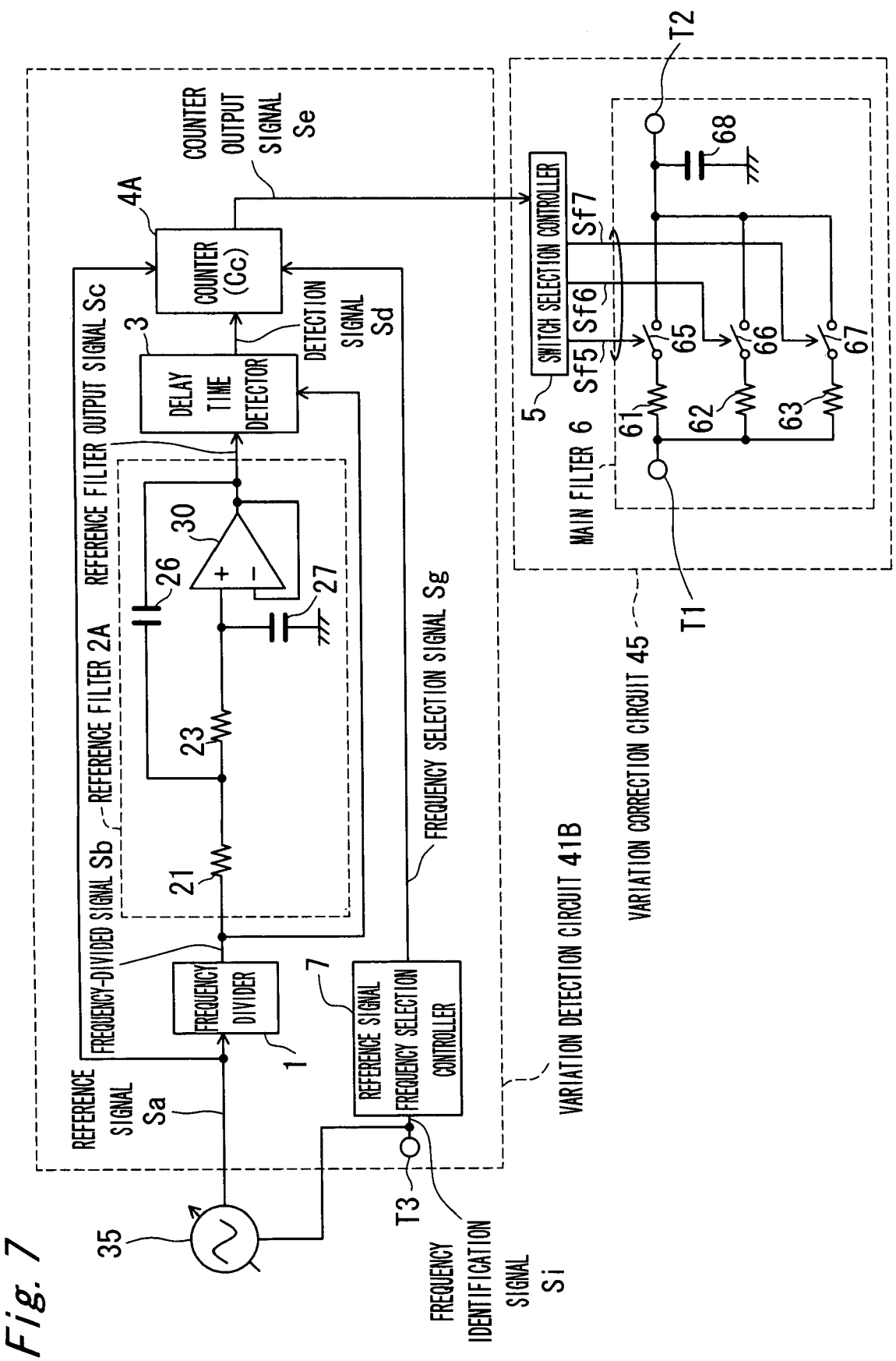
FIG. 7 is a block diagram showing a configuration of a filtering apparatus according to a third preferred embodiment of the present invention.

FIG. 7 is a block diagram showing a configuration of a filtering apparatus according to a third preferred embodiment of the present invention. The filtering apparatus of the present preferred embodiment is different in that a variation detection circuit 41B is provided in place of the variation detection circuit 41, as compared with the filtering apparatus according to the first preferred embodiment shown in FIG. 1. The variation detection circuit 41B is different in that a reference filter 2A and a counter 4A are provided in place of the reference filter 2 and the counter 4, as compared with the variation detection circuit 41 of FIG. 1. The other configurations other than that are the same as the filtering apparatus according to the first preferred embodiment shown in FIG. 1, and repeated description of components labeled with the same reference numerals will be omitted.

Referring to FIG. 7, a reference signal frequency selection controller 7 outputs a frequency selection signal Sg which corrects a counted value Cc of the counter 4A on the basis of a frequency identification signal Si inputted via a frequency identification signal input terminal T3. The reference filter 2A is different in that the switches 28 and 29 and the resistors 22 and 24 are deleted as compared with the reference filter 2 of FIG. 1; and a series circuit of resistors 21 and 23 is connected between a non-inversion input terminal of an amplifier 30 and the frequency divider 1. The counter 4A counts that the high level time interval of the detection signal Sd from the delay time detector 3 is how many times as long as the time cycle of a reference signal Sa inputted from the oscillator 35, multiplies the counted value Cc by a correction coefficient which is switched over by the frequency selection signal Sg, and outputs the counter output signal Se indicating a multiplying value.

Figure 8:
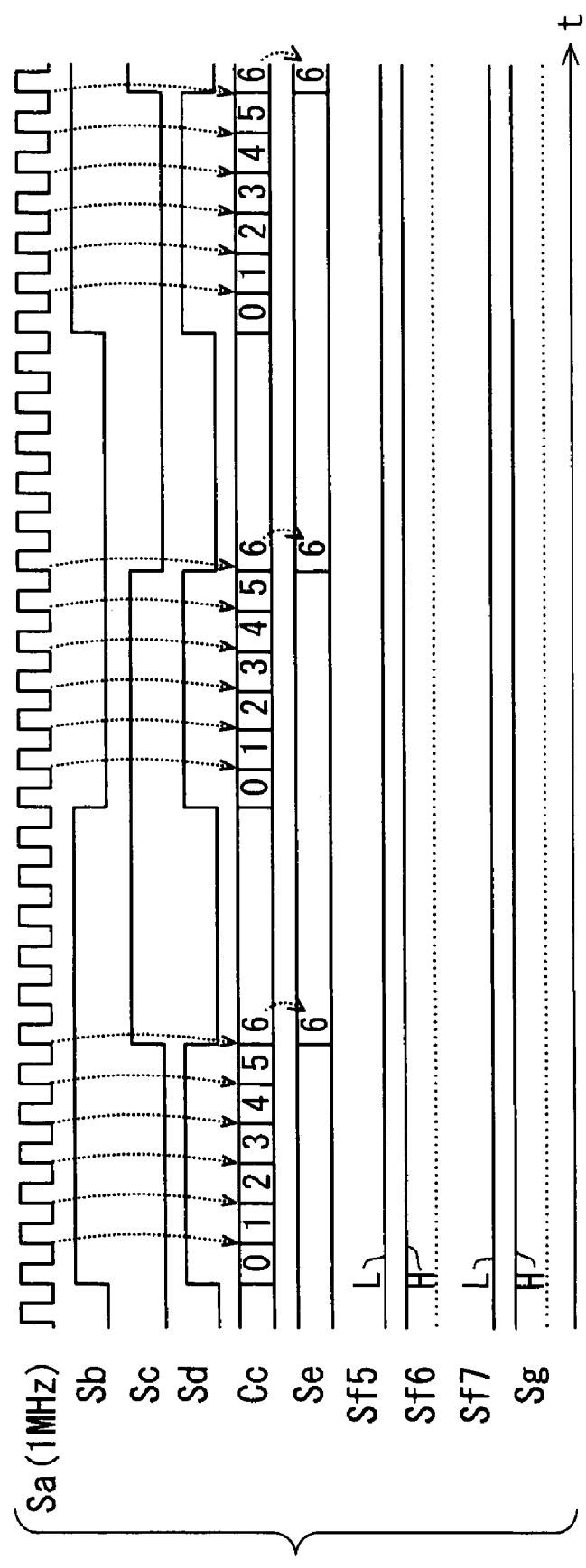
FIG. 8 is a timing chart showing signals of respective sections in the case where a frequency of a reference signal Sa in the filtering apparatus of FIG. 7 is 1 MHz.
Figure 9:
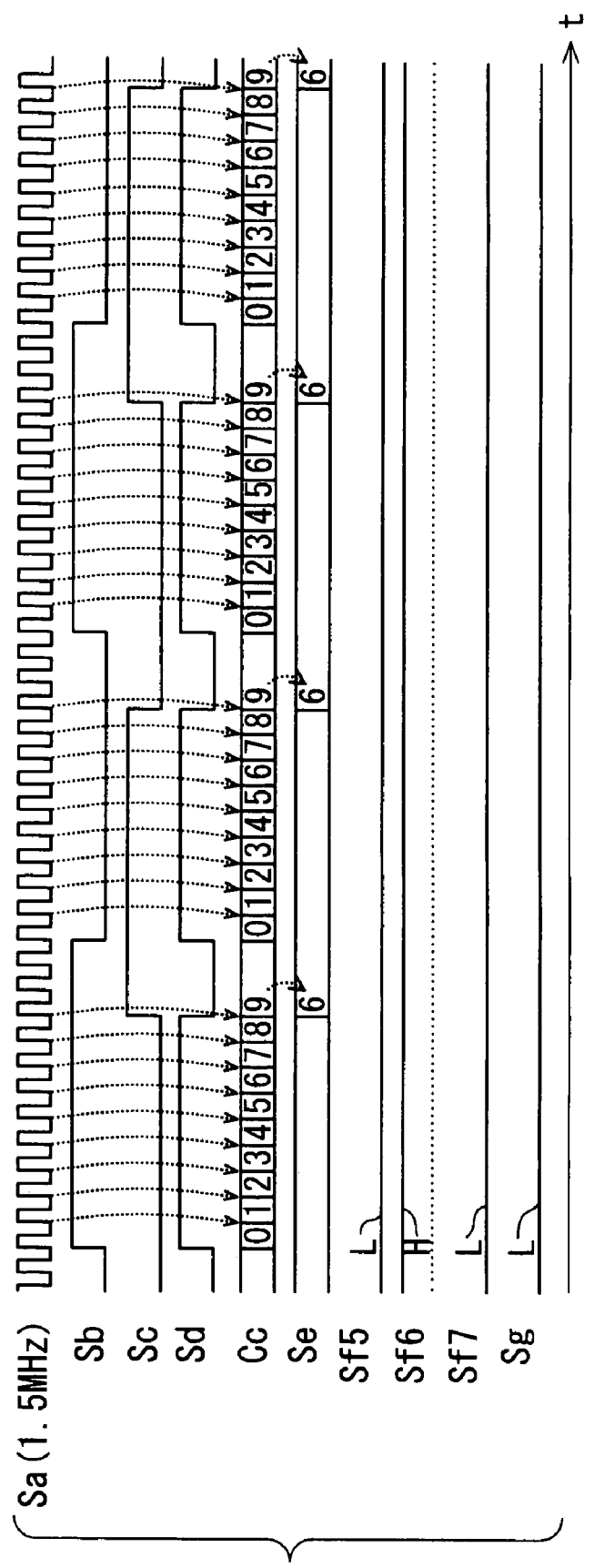
FIG. 9 is a timing chart showing signals of respective sections in the case where the frequency of the reference signal Sa in the filtering apparatus of FIG. 7 is 1.5 MHz.

In the filtering apparatus configured as described above, a specific example will be described below on the case where the frequency of the reference signal Sa is changed at 1 MHz and 1.5 MHz, respectively. FIGS. 8 and 9 are timing charts showing signals of respective sections in the case where the frequencies of the reference signal Sa in the filtering apparatus of FIG. 7 are 1 MHz and 1.5 MHz, respectively.

The counter 4A counts that the high level time interval of the detection signal Sd from the delay time detector 3 is how many times as long as the time cycle of the reference signal Sa. However, since the high level time interval of the detection signal Sd is determined by group delay characteristics of the reference filter 2A, the high level time interval of the detection signal Sd becomes the same time interval regardless of the frequency of the reference signal Sa. Thus the counted value Cc of the counter 4A changes with the change of the frequency of the reference signal Sa. Consequently, in the filtering apparatus according to the present preferred embodiment, the counted value Cc of the counter 4A is corrected by the reference signal frequency selection controller 7 in response to the frequency of the reference signal Sa.

As shown in FIG. 8, when the frequency of the reference signal Sa is 1 MHz, the counter 4A sets a correction coefficient for the counted value Cc of the counter 4A to "1," because the frequency selection signal Sg from the reference signal frequency selection controller 7 has the high level. The counter 4A multiplies the maximum number "6" of the counted value Cc of the counter 4A by the correction coefficient "1," and then outputs the counter output signal Se indicating a multiplication result "6."

In addition, as shown in FIG. 9, when the frequency of the reference signal Sa is 1.5 MHz, the counter 4A sets the correction coefficient for the counted value Cc of the counter 4A to "$\frac{2}{3}$," because the frequency selection signal Sg from the reference signal frequency selection controller 7 has the low level. The counter 4A multiplies the maximum number "9" of the counted value Cc of the counter 4A by the correction coefficient "$\frac{2}{3}$," and outputs the counter output signal Se indicating a multiplication result "6." Further, the correction coefficient of the counter 4A is set so as to be inversely proportional to the frequency of the reference signal Sa.

Therefore, the maximum value of the counter 4A is changed in response to the frequency of the reference signal Sa. However, the counter output signal Se of the counter 4A becomes the same signal regardless of the frequency of the reference signal Sa, because the counted value Cc of the counter 4A is corrected according to the frequency selection signal Sg from the reference signal frequency selection controller 7. Therefore, even if the frequency of the reference signal Sa varies, the same switch selection signals Sf5, Sf6 and Sf7 can be obtained, and frequency characteristics of a main filter 6 is not changed.

As described above, according to the filtering apparatus according to the preferred embodiment, in the configuration that the resistor of the main filter 6 is selected in response to a variation of CR-product of the reference filter 2A for the reference signal Sa having a certain particular frequency, even in the case where a plurality of reference signals Sa having different frequencies are used, the variation of the CR-product of the reference filter 2A can be correctly detected, the variation of the frequency characteristics of the main filter 6 can be accurately corrected, and the frequency characteristics of the main filter 6 can be always substantially constant.

Further, in the present preferred embodiment, the reference signal Sa is switched over to two frequencies of 1 MHz and 1.5 MHz. However, the present invention is not limited to the frequencies of the reference signal Sa of 1 MHz and 1.5 MHz, but, the reference signal Sa may be switched over to frequencies less than three; and in this case, the correction coefficient may be switched over by the reference signal frequency selection controller 7 so that the correction coefficient for the counted result of the counter 4A is inversely proportional to the frequency of the reference signal Sa.

In addition, the reference filter 2A may output the reference filter output signal Sc in which the frequency-divided signal Sb is delayed by the group delay time according to the CR-product of the reference filter 2A. The reference filter 2A may be a circuit configuration other than the circuit configuration shown in FIG. 3 if that is the case where the reference filter 2A includes a resistor and a capacitor.

Fourth Preferred Embodiment

Figure 10:
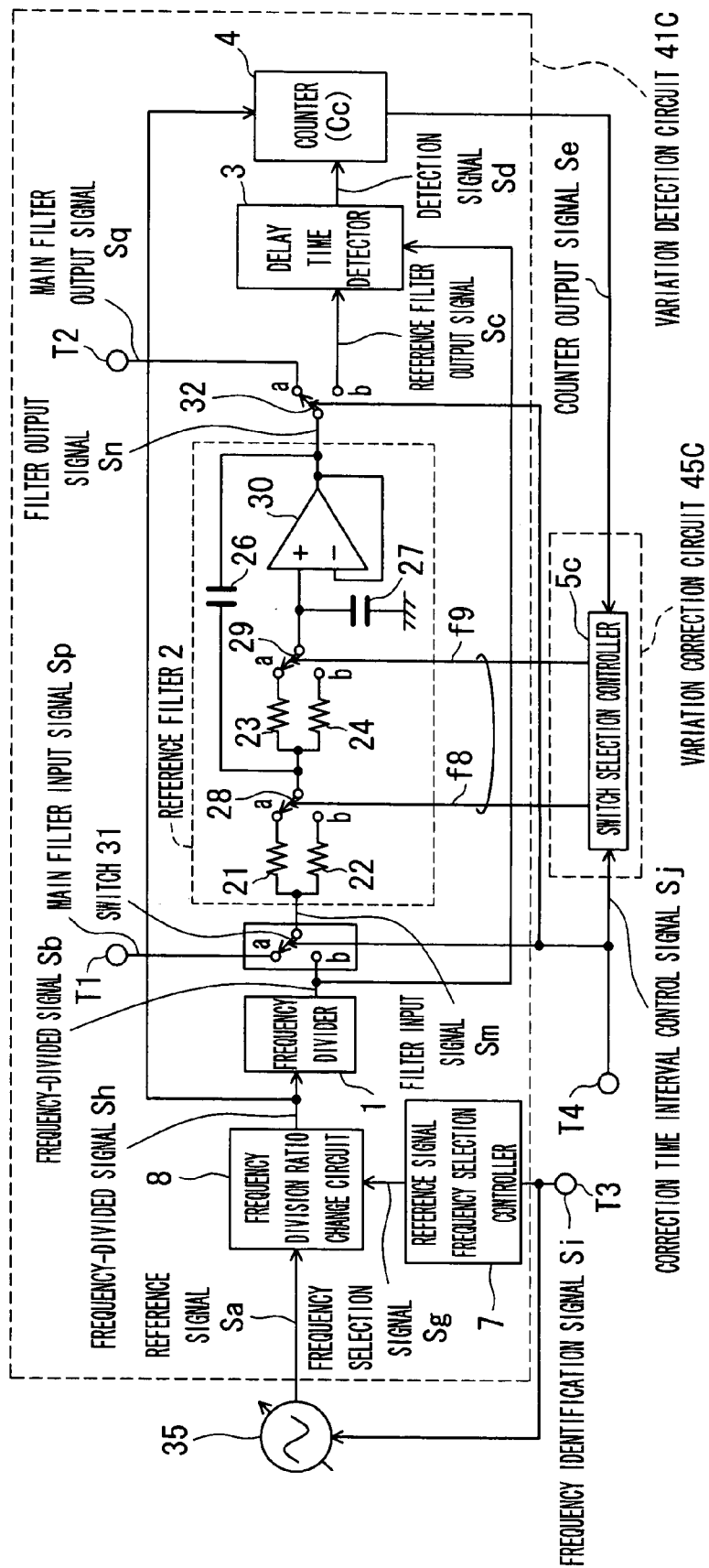
FIG. 10 is a block diagram showing a configuration of a filtering apparatus according to a fourth preferred embodiment of the present invention.

FIG. 10 is a block diagram showing a configuration of a filtering apparatus according to a fourth preferred embodiment of the present invention. The filtering apparatus of the present preferred embodiment is different in that a variation detection circuit 41C and a variation correction circuit 45C are provided in place of the variation detection circuit 41 and the variation correction circuit 45, as compared with the filtering apparatus according to the first preferred embodiment shown in FIG. 1. The variation detection circuit 41C is different in that a frequency division ratio change circuit 8 and switches 31 and 32 are further provided, as compared with the variation detection circuit 41 of FIG. 1. The other configurations other than that are the same as the filtering apparatus according to the first preferred embodiment shown in FIG. 1, and repeated description of components labeled with the same reference numerals will be omitted.

Referring to FIG. 10, the frequency division ratio change circuit 8 frequency-divides a reference signal Sa inputted from an oscillator 35 by a frequency division ratio based on a frequency selection signal Sg, and then outputs a frequency-divided signal Sh having a predetermined frequency. A reference signal frequency selection controller 7 outputs the frequency selection signal Sg which controls the frequency division ratio of the frequency division ratio change circuit 8 so that the signal frequency of the frequency-divided signal Sh becomes constant in response to a frequency identification signal Si inputted via a frequency identification signal input terminal T3. Further, an operation of the frequency division ratio change circuit 8 is the same as that of the frequency division ratio change circuit 8 of the filtering apparatus according to the second preferred embodiment, and therefore, its detailed description will be omitted.

The switch 31 is controlled by a correction time interval control signal Sj which is inputted via a correction time interval control signal input terminal T4, and which is for controlling a variation correction time interval; in the case of the variation correction time interval, the frequency divider 1 is connected to the reference filter 2 via a contact "b" thereof; and in the case of not the variation correction time interval, a main filter input signal Sp is inputted to the reference filter 2 via the main filter input terminal T1 and via a contact "a" thereof. In addition, a switch 32 is controlled by the above correction time interval control signal Sj; in the case of the variation correction time interval, the reference filter 2 is connected to a delay time detector 3 via a contact "b" thereof; and in the case of not the variation correction time interval, a filter output signal Sn from the reference filter 2 is outputted as a main filter output signal Sq via a contact "a" thereof and via the main filter output terminal T2. The correction time interval control signal Sj is a signal for controlling a variation correction time interval of the CR-product of the reference filter 2; in the case of the high level, the correction time interval control signal Sj indicates the variation correction time interval. In the case of the low level, the correction time interval control signal Sj indicates a main filter operation time interval.

The variation correction circuit 45C includes a switch selection controller 5C. The switch selection controller 5C generates and outputs switch selection signals Sf8 and Sf9 respectively controlling switches 28 and 29 of the reference filter 2 on the basis of the counter output signal Se from the counter 4 and the correction time interval control signal Sj.

Figure 11:
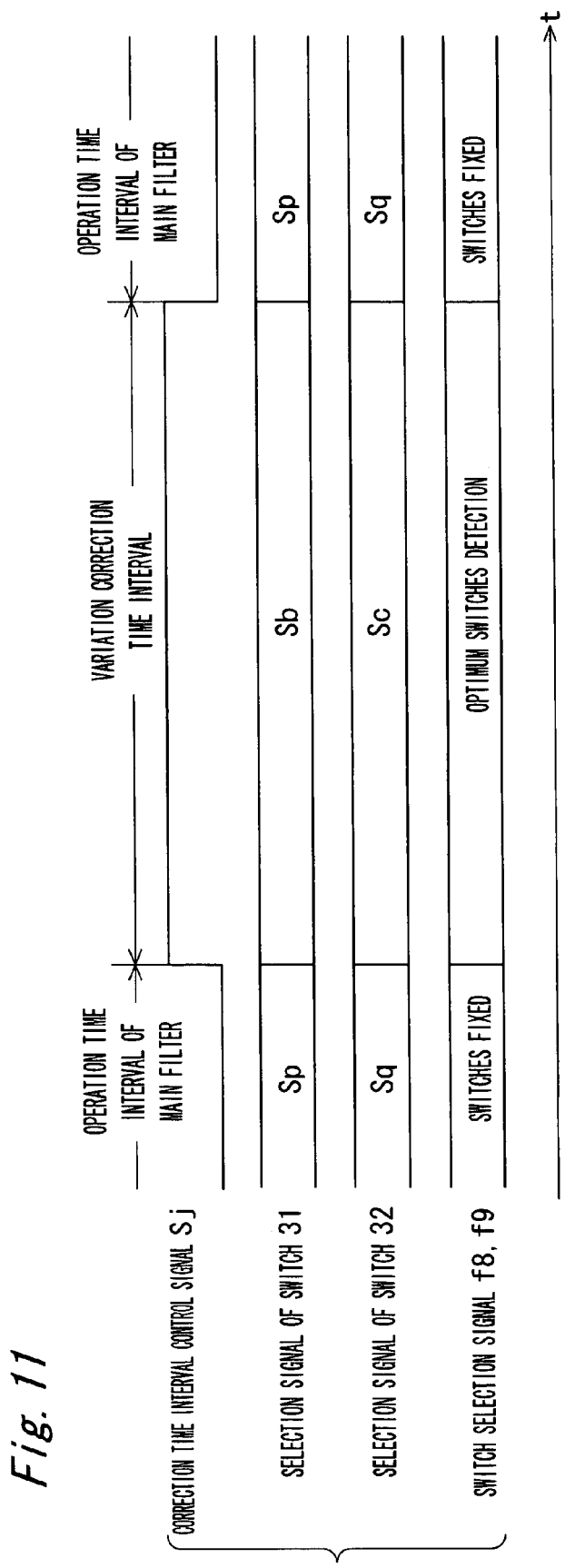
FIG. 11 is a timing chart showing a switching operation of a reference filter and a main filter in the filtering apparatus of FIG. 10.

In the filtering apparatus configured as described above, its operation will be described below. FIG. 11 is a timing chart showing the switching operation of the reference filter and the main filter in the filtering apparatus of FIG. 10.

Referring to FIG. 11, first of all, when the correction time interval control signal Sj is the high level, the switches 31 and 32 are switched over to the contact "b" side by the correction time interval control signal Sj to be switched over to the variation correction time interval, the frequency-divided signal Sb is inputted to the reference filter 2 via the switch 31. Then the filter output signal Sn is inputted to the delay time detector 3 via the switch 32. At this time, the variation of the CR-product of the reference filter 2 is detected by the oscillator 35, the frequency division ratio change circuit 8, the frequency divider 1, the reference filter 2, the delay time detector 3, the counter 4 and the reference signal frequency selection controller 7. Frequency characteristics of the reference filter 2 are corrected by controlling the switches 28 and 29 of the reference filter 2 by the switch selection controller 5C. After the variation of the CR-product has been corrected, the correction time interval control signal Sj is controlled to the low level.

When the correction time interval control signal Sj is the low level, the switches 31 and 32 are switched over to the contact "a" side by the correction time interval control signal Sj to be switched over to the main filter operation time interval. At this time, the switch selection signals Sf8 and Sf9 from the switch selection controller 5C are fixed to a value at the time that the correction time interval control signal Sj is the high level; and the reference filter 2 is operated as the main filter to which the main filter input signal Sp is inputted via the main filter input terminal T1 and the switch 31, and from which the main filter output signal Sq is outputted via the switch 32 and the main filter output terminal T2 in a state where the variation of the CR-product is corrected.

As described above, according to the filtering apparatus according to the present preferred embodiment, the reference filter 2 is also used as the main filter by switching the switches 31 and 32; and accordingly, not only a variation of an absolute value but also a variation of a relative value in CR-product can be corrected, and the frequency characteristics of the filtering apparatus can be maintained constant by highly accurately correcting the variation of the CR-product.

In addition, in the present preferred embodiment, the reference filter 2A in the filtering apparatus according to the second preferred embodiment is also used as the main filter. However, the present invention is not limited to this, but the same configuration may be applied to the filtering apparatus according to the first or the third preferred embodiment.

Further, the correction time interval control signal Sj has the high level in the variation correction time interval of the CR-product of the reference filter 2, and has the low level in the operation time interval of the main filter. However, the present invention is not limited to this, but the correction time interval control signal Sj may have the low level in the variation correction time interval of the CR-product of the reference filter 2, and have the high level not in the variation correction time interval.

Figure 12:
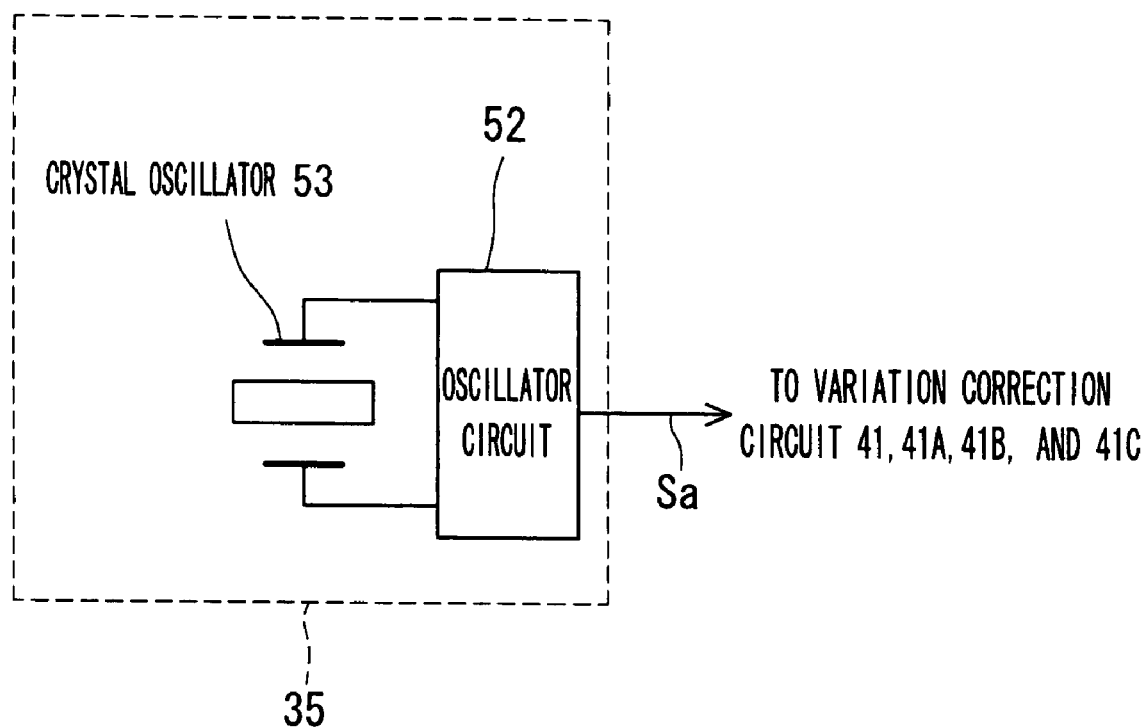
FIG. 12 is a block diagram showing a configuration of an oscillator 35 of FIGS. 1, 4, 7 and 10.
Figure 13:
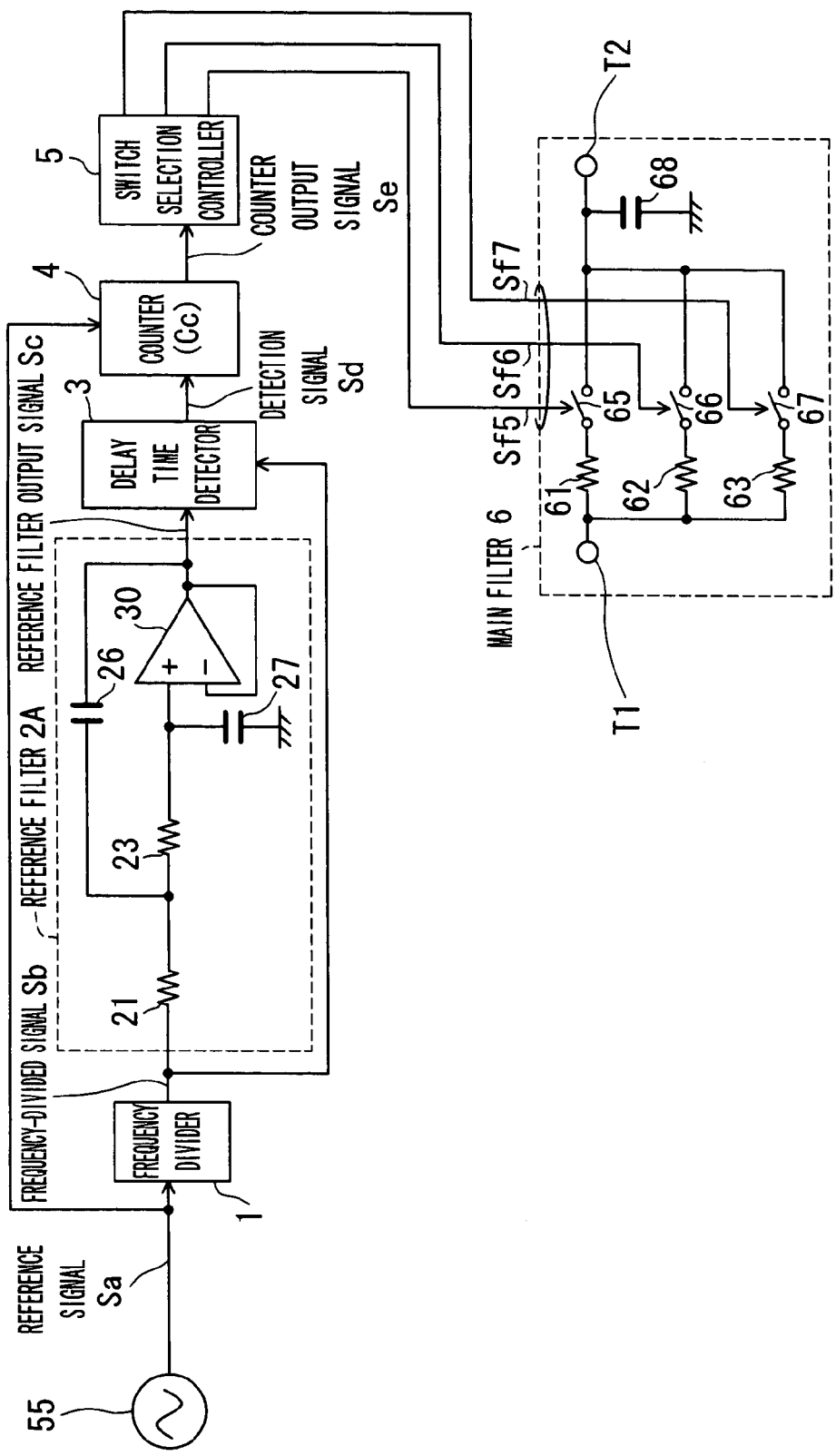
FIG. 13 is a block diagram showing a configuration of a filtering apparatus according to a prior art.
Figure 14:
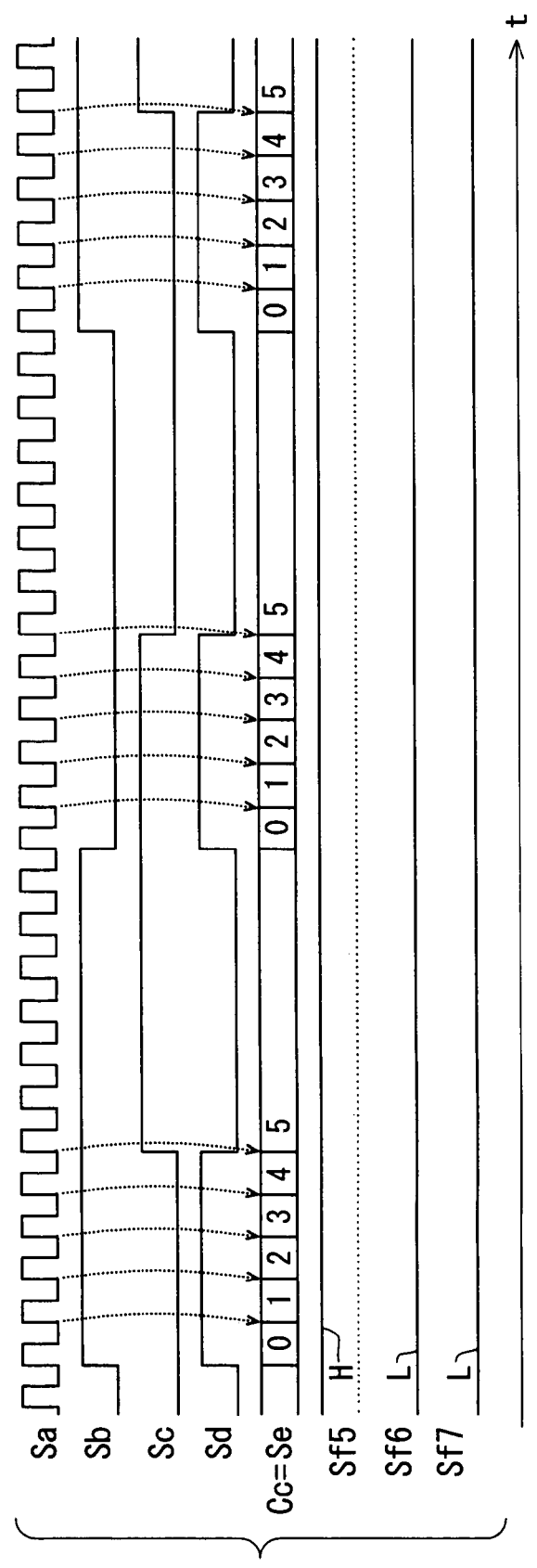
FIG. 14 is a timing chart showing signals of respective sections in the case where a variation of CR-product of a reference filter 2A in the filtering apparatus of FIG. 13 is −10%.
Figure 15:
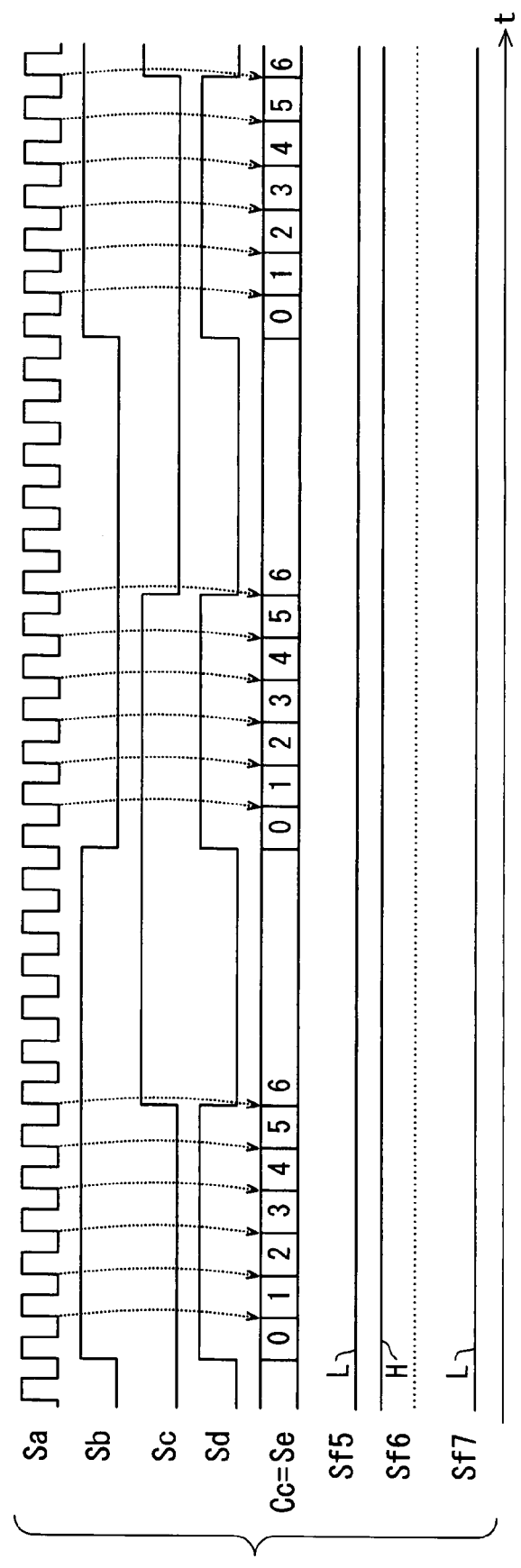
FIG. 15 is a timing chart showing signals of respective sections in the case where the variation of the CR-product of the reference filter 2A in the filtering apparatus of FIG. 13 is 0%.
Figure 16:
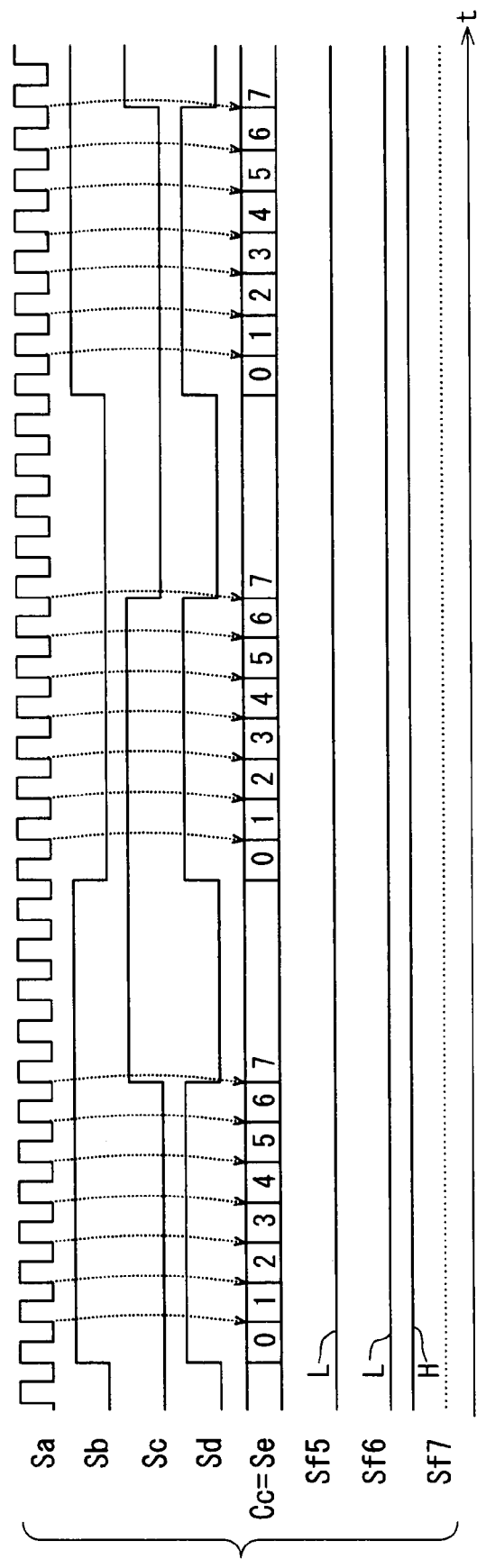
FIG. 16 is a timing chart showing signals of respective sections in the case where the variation of the CR-product of the reference filter 2A in the filtering apparatus of FIG. 13 is 10%.
Figure 17:
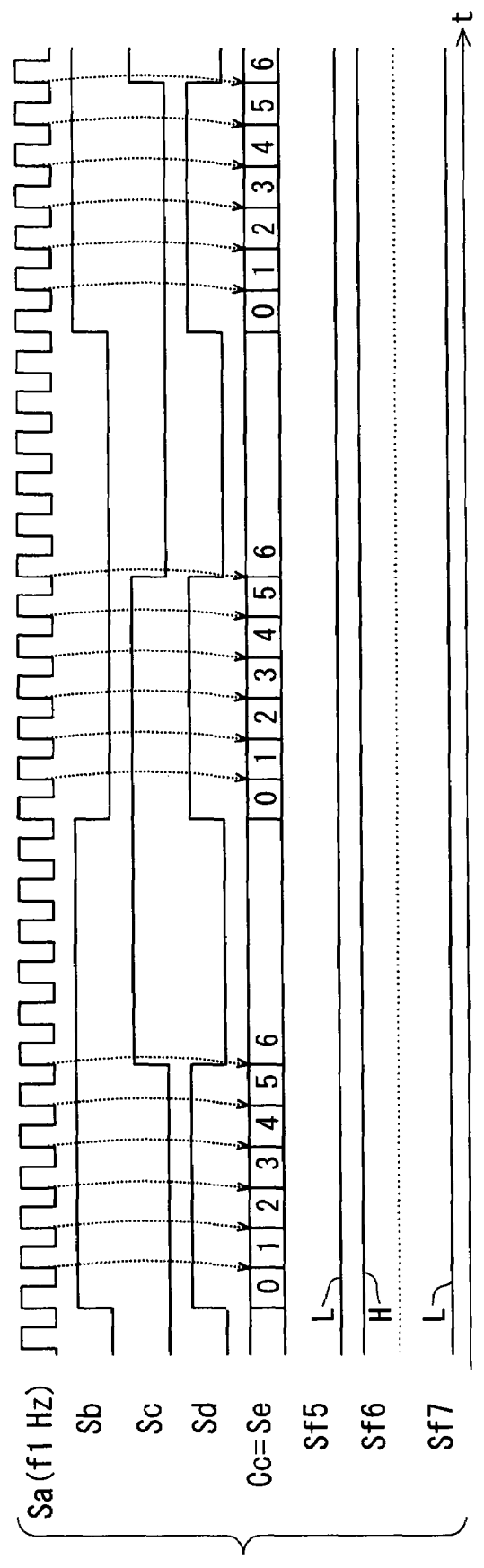
FIG. 17 is a timing chart showing signals of respective sections in the case where a frequency of a reference signal Sa in the filtering apparatus of FIG. 13 is a frequency f1.
Figure 18:
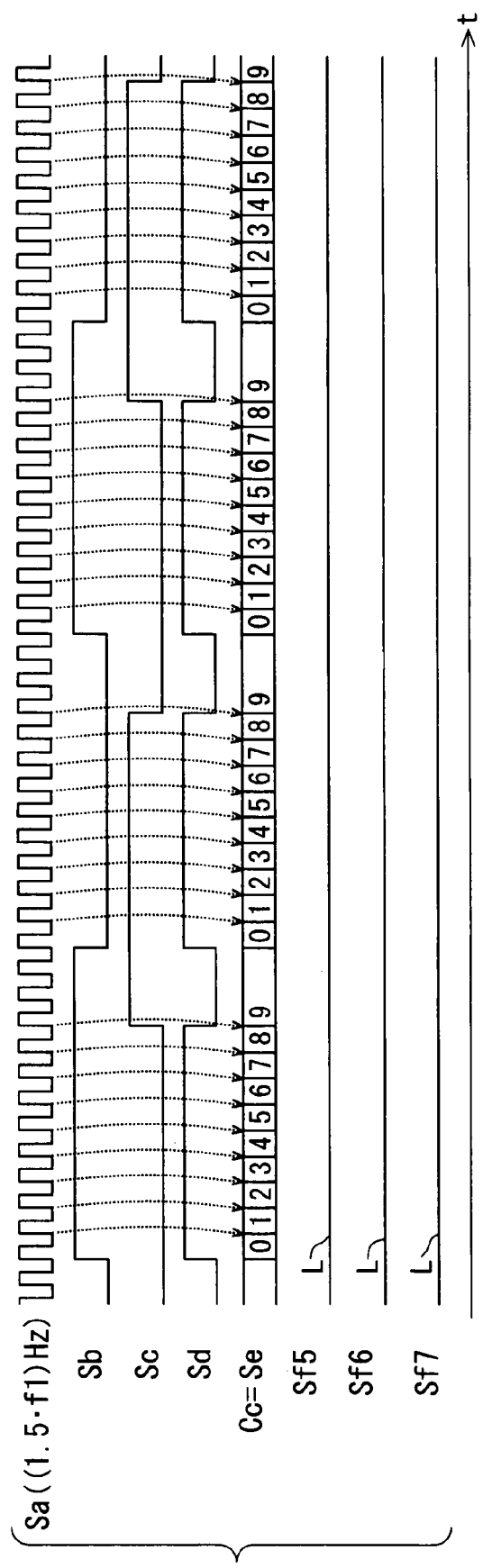
FIG. 18 is a timing chart showing signals of respective sections in the case where the frequency of the reference signal Sa in the filtering apparatus of FIG. 13 is 1.5 times as high as the frequency f1.

Still further, the filtering apparatuses according to the above first to fourth preferred embodiments include the oscillator 35; however, the present invention is not limited to this, but the oscillator 35 may be provided outside the filtering apparatus. However, in the case where the filtering apparatus includes the oscillator 35, the reference signal Sa has no need to be supplied from outside because the reference signal Sa is generated inside the filtering apparatus. Therefore there is an effect that the number of the components can be reduced. In addition, for example, the oscillator 35 may include an oscillator circuit 52 and a crystal oscillator 53 as shown in FIG. 12. In this case, when the crystal oscillator 53 is changed to change the reference signal Sa, even if frequency of the reference signal Sa is changed, the variation of the CR-product of the reference filter 2 can be correctly detected, the variation of frequency characteristics of the filtering apparatus can be accurately corrected, and the frequency characteristics of the filtering apparatus can be always substantially constant.

In addition, each of the filtering apparatuses according to the above first to fourth preferred embodiments is built into a semiconductor apparatus; and accordingly, even a plurality of reference signals Sa having different frequencies are used, it is possible to realize the semiconductor apparatus in which the variation of the CR-product of the reference filters 2 and 2A can be correctly detected, the variation of frequency characteristics of the filtering apparatus can be accurately corrected, and the frequency characteristics of the built-in filtering apparatus can be always substantially constant.

Even in the case where a plurality of reference signals having different frequencies from each other are used, the filtering apparatus and the semiconductor apparatus having the same according to the present invention can correctly detect the variation of the CR-product of the reference filter in response to each of the plurality of reference signals, can accurately correct the variation of frequency characteristics of the main filter, and can make the frequency characteristics of the main filter always substantially constant.

For example, in filtering apparatuses and semiconductor apparatuses using a plurality of reference signals having different frequencies, the filtering apparatus and the semiconductor apparatus having the same according to the present invention serve as a apparatus which corrects a variation.

As described above, the present invention is described in detail by the preferred embodiments. However, the present invention is not limited to those. It is obvious to those skilled in the art that the present invention can be applicable to various changed and modified preferred embodiments in the scope of technical idea of the present invention as set forth in the appended claims.

What is claimed is:

1. A filtering apparatus having a main filter, the filtering apparatus comprising:
   a variation detection circuit including a reference filter having at least one first resistor and at least one first capacitor, the variation detection circuit detecting a variation of a CR-product, which is a product of a resistance value of the at least one first resistor times a capacitance value of the at least one first capacitor, in response to each of a plurality of reference signals having different frequencies from each other, and outputting a variation detection signal indicating a detected result; and
   a variation correction circuit for receiving the variation detection signal from said variation detection circuit and for correcting frequency characteristics of the main filter based on the variation detection signal;
   wherein the variation detection circuit includes:
   a frequency divider for frequency-dividing the reference signal by a predetermined frequency division ratio, and outputting a frequency-divided signal to the reference filter;
   a reference signal frequency selection controller for generating a frequency selection signal for switching over group delay characteristics of the reference filter based on the frequency of the reference signal, and outputting the frequency selection signal to the reference filter, wherein the group delay characteristic is based on the at least one first resistor and the at least one first capacitor of the reference filter;
   a delay time detector for detecting and outputting a delay time of an output signal of the reference filter for the frequency-divided signal; and
   a counter for counting a multiple of a signal time cycle of the reference signal for the delay time detected by the delay time detector, and outputting the variation detection signal including a counted result to the variation correction circuit.

2. The filtering apparatus as claimed in claim 1,
   wherein the reference filter has one of a plurality of first resistors and a plurality of first capacitors, and
   wherein the reference signal frequency selection controller switches over the group delay characteristics of the reference filter by generating the frequency selection signal for selecting one of at least one resistor, at least one capacitor of the plurality of first resistors and the plurality of first capacitors based on the frequency of the reference signal, and outputting the frequency signal to the reference filter.

3. The filtering apparatus as claimed in claim 1, further comprising a switch for connecting the reference filter to the frequency-divider and the delay time detector during a variation correction time interval, and for disconnecting the reference filter from the frequency-divider and the delay time detector so that the reference filter operates as the main filter during an operation time interval of the main filter.

4. The filtering apparatus as claimed in claim 1,
   wherein the main filter includes a plurality of second resistors and a plurality of second capacitors, and
   wherein the variation correction circuit includes a switch selection controller for switching over the frequency characteristics of the main filter by selecting one of at least one resistor, at least one capacitor of the plurality of second resistors and the plurality of second capacitors based on the variation detection signal inputted from the counter.

5. The filtering apparatus as claimed in claim 1, further comprising an oscillator for generating and outputting the reference signal.

6. A filtering apparatus having a main filter, the filtering apparatus comprising:
   a variation detection circuit including a reference filter having at least one first resistor and at least one first capacitor, the variation detection circuit detecting a variation of a CR-product, which is a product of a resistance value of the at least one first resistor times a capacitance value of the at least one first capacitor, in response to each of a plurality of reference signals having different frequencies from each other, and outputting a variation detection signal indicating a detected result; and
   a variation correction circuit for receiving the variation detection signal from said variation detection circuit and for correcting frequency characteristics of the main filter based on the variation detection signal;
   wherein the variation detection circuit includes:
   a frequency division ratio change circuit for frequency-dividing the reference signal by one of a plurality of first frequency division ratios in response to a frequency selection signal, and then outputting a first frequency-divided signal;
   a frequency divider for frequency-dividing the first frequency-divided signal by a predetermined second frequency division ratio, and then outputting a second frequency-divided signal to the reference filter;
   a reference signal frequency selection controller for generating the frequency selection signal for switching over the first frequency division ratio of the frequency division ratio change circuit among the plurality of first frequency division ratios based on the frequency of the reference signal, and outputting the frequency selection signal to the frequency selection signal to the frequency division ratio change circuit;

a delay time detector for detecting and outputting a delay time of an output signal of the reference filter for the second frequency-divided signal; and a counter for counting a multiple of a signal time cycle of the first frequency-divided signal for the delay time detected by the delay time detector, and then outputting the variation detection signal including a counted result to the variation correction circuit.

7. The filtering apparatus as claimed in claim 6, further comprising a switch circuit for connecting the reference filter to the frequency-divider and the delay time detector during a variation correction time interval, and for disconnecting the reference filter from the frequency-divider and the delay time detector so that the reference filter operates as the main filter during an operation time interval of the main filter.

8. The filtering apparatus as claimed in claim 6,
wherein the main filter includes a plurality of second resistors and a plurality of second capacitors, and
wherein the variation correction circuit includes a switch selection controller for switching over the frequency characteristics of the main filter by selecting one of at least one resistor, at least one capacitor of the plurality of second resistors and the plurality of second capacitors based on the variation detection signal inputted from the counter.

9. The filtering apparatus as claimed in claim 6, further comprising an oscillator for generating and outputting the reference signal.

10. A filtering apparatus having a main filter, the filtering apparatus comprising:
a variation detection circuit including a reference filter having at least one first resistor and at least one first capacitor, the variation detection circuit detecting a variation of a CR-product, which is a product of a resistance value of the at least one first resistor times a capacitance value of the at least one first capacitor, in response to each of a plurality of reference signals having different frequencies from each other, and outputting a variation detection signal indicating a detected result; and
a variation correction circuit for receiving the variation detection signal from said variation detection circuit and for correcting frequency characteristics of the main filter based on the variation detection signal;
wherein the variation detection circuit includes:
a frequency divider for frequency-dividing the reference signal by a predetermined first frequency division ratio, and then outputting a first frequency-divided signal to the reference filter;
a delay time detector for detecting a delay time of an output signal of the reference filter for the first frequency-divided signal;
a counter for counting a multiple of a signal time cycle of the reference signal for a delay time detected by the delay time detector, multiplying a counted result by a correction coefficient included in a frequency selection signal, and then outputting the variation detection signal including a multiplied result to the variation correction circuit; and
a reference signal frequency selection controller for generating the frequency selection signal including the correction coefficient of the counter based on the frequency of the reference signal, and outputting the frequency selection signal to the counter.

11. The filtering apparatus as claimed in claim 10, further comprising a switch circuit for connecting the reference filter to the frequency-divider and the delay time detector during a variation correction time interval, and for disconnecting the reference filter from the frequency-divider and the delay time detector so that the reference filter operates as the main filter during an operation time interval of the main filter.

12. The filtering apparatus as claimed in claim 10,
wherein the main filter includes a plurality of second resistors and a plurality of second capacitors, and
wherein the variation correction circuit includes a switch selection controller for switching over the frequency characteristics of the main filter by selecting one of at least one resistor, at least one capacitor of the plurality of second resistors and the plurality of second capacitors based on the variation detection signal inputted from the counter.

13. The filtering apparatus as claimed in claim 10, further comprising an oscillator for generating and outputting the reference signal.

14. A semiconductor apparatus having a filtering apparatus having a main filter,
the filtering apparatus comprising:
a variation detection circuit including a reference filter having at least one first resistor and at least one first capacitor, the variation detection circuit detecting a variation of CR-product, which is a product of a resistance value of the at least one first resistor times a capacitance value of the at least one first capacitor, in response to each of a plurality of reference signals having different frequencies from each other, and outputting a variation detection signal indicating a detected result; and
a variation correction circuit for correcting frequency characteristics of the main filter based on the variation detection signal,
wherein the variation detection circuit includes:
a frequency divider for frequency-dividing the reference signal by a predetermined frequency division ratio, and outputting a frequency-divided signal to the reference filter;
a reference signal frequency selection controller for generating a frequency selection signal for switching over group delay characteristics of the reference filter based on the frequency of the reference signal, and outputting the frequency selection signal to the reference filter, wherein the group delay characteristic is based on the at least one first resistor and the at least one first capacitor of the reference filter;
a delay time detector for detecting and outputting a delay time of an output signal of the reference filter for the frequency-divided signal; and
a counter for counting a multiple of a signal time cycle of the reference signal for the delay time detected by the delay time detector, and outputting the variation detection signal including a counted result to the variation correction circuit.

15. A semiconductor apparatus having a filtering apparatus having a main filter,
the filtering apparatus comprising:
a variation detection circuit including a reference filter having at least one first resistor and at least one first capacitor, the variation detection circuit detecting a variation of CR-product, which is a product of a resistance value of the at least one first resistor times a capacitance value of the at least one first capacitor, in response to each of a plurality of reference signals having different frequencies from each other, and outputting a variation detection signal indicating a detected result; and
a variation correction circuit for correcting frequency characteristics of the main filter based on the variation detection signal, wherein the variation detection circuit includes:
a frequency division ratio change circuit for frequency-dividing the reference signal by one of a plurality of first frequency division ratios in response to a frequency selection signal, and then outputting a first frequency-divided signal;
a frequency divider for frequency-dividing the first frequency-divided signal by a predetermined second frequency division ratio, and then outputting a second frequency-divided signal to the reference filter;
a reference signal frequency selection controller for generating the frequency selection signal for switching over the first frequency division ratio of the frequency division ratio change circuit among the plurality of first frequency division ratios based on the frequency of the reference signal, and outputting the frequency selection signal to the frequency selection signal to the frequency division ratio change circuit;
a delay time detector for detecting and outputting a delay time of an output signal of the reference filter for the second frequency-divided signal; and
a counter for counting a multiple of a signal time cycle of the first frequency-divided signal for the delay time detected by the delay time detector, and then outputting the variation detection signal including a counted result to the variation correction circuit.

16. A semiconductor apparatus having a filtering apparatus having a main filter,
the filtering apparatus comprising:
a variation detection circuit including a reference filter having at least one first resistor and at least one first capacitor, the variation detection circuit detecting a variation of CR-product, which is a product of a resistance value of the at least one first resistor times a capacitance value of the at least one first capacitor, in response to each of a plurality of reference signals having different frequencies from each other, and outputting a variation detection signal indicating a detected result; and
a variation correction circuit for correcting frequency characteristics of the main filter based on the variation detection signal,
wherein the variation detection circuit includes:
a frequency divider for frequency-dividing the reference signal by a predetermined first frequency division ratio, and then outputting a first frequency-divided signal to the reference filter;
a delay time detector for detecting a delay time of an output signal of the reference filter for the first frequency-divided signal;
a counter for counting a multiple of a signal time cycle of the reference signal for a delay time detected by the delay time detector, multiplying a counted result by a correction coefficient included in a frequency selection signal, and then outputting the variation detection signal including a multiplied result to the variation correction circuit; and
a reference signal frequency selection controller for generating the frequency selection signal including the correction coefficient of the counter based on the frequency of the reference signal, and outputting the frequency selection signal to the counter.

* * * * *